United States Patent [19]

Yamada et al.

[11] Patent Number: 5,729,076
[45] Date of Patent: Mar. 17, 1998

[54] SURFACE ACOUSTIC WAVE DEVICE, EQUIPMENT INCLUDING THE SAME WITH ELECTRIC CIRCUIT CONNECTED THERETO AND MEASURING METHOD OF PARAMETERS THEREOF

[75] Inventors: Yoshihiro Yamada; Takashi Shiba; Katsumi Itoh, all of Kanagawa, Japan

[73] Assignee: Hitachi, Ltd., Tokyo, Japan

[21] Appl. No.: 452,704

[22] Filed: May 30, 1995

Related U.S. Application Data

[63] Continuation of Ser. No. 115,740, Sep. 3, 1993, abandoned.

[30] Foreign Application Priority Data

Sep. 9, 1992 [JP] Japan .................. 4-240977

[51] Int. Cl.⁶ .................................. H03H 9/64
[52] U.S. Cl. .................. 310/313 R; 310/316; 310/317
[58] Field of Search .......................... 333/193–196, 333/150–155; 310/313 R, 313 B, 313 C, 313 D, 316, 317

[56] References Cited

U.S. PATENT DOCUMENTS

| | | | |
|---|---|---|---|
| 4,200,849 | 4/1980 | Malocha | 310/316 |
| 4,254,388 | 3/1981 | Mikoshiba et al. | 333/195 |
| 4,422,000 | 12/1983 | Yamada et al. | 310/313 D |
| 4,575,696 | 3/1986 | Hartmann et al. | 310/316 |
| 4,599,587 | 7/1986 | Hartmann et al. | 333/176 |
| 4,602,228 | 7/1986 | Yamada | 310/313 D |
| 4,694,266 | 9/1987 | Wright | 333/196 |
| 4,733,207 | 3/1988 | Peach | 333/193 |
| 4,749,964 | 6/1988 | Ash | 331/107 A |
| 4,818,961 | 4/1989 | Takahashi et al. | 310/316 |
| 5,028,895 | 7/1991 | Fliegel | 333/176 |
| 5,105,162 | 4/1992 | Fleissner et al. | 329/359 |
| 5,473,295 | 12/1995 | Turunen | 333/132 |

FOREIGN PATENT DOCUMENTS 53-20840 2/1928 Japan .................. H03H 9/00

*Primary Examiner*—Thomas M. Dougherty
*Attorney, Agent, or Firm*—Antonelli, Terry, Stout, & Kraus, LLP

[57] ABSTRACT

A surface acoustic wave device having a novel structure capable of restricting TTE and ripple noise on a frequency characteristics and group delay time characteristics thereof is provided under a condition by which acoustic reflection is suppressed when there is internal dissipation in the device and/or a peripheral circuit thereof. When the device includes a unidirectional interdigital transducer, it is possible to restrict ripple of the frequency characteristics and the group delay time characteristics and to reduce loss without using a phase shifter. By using the surface acoustic wave device according to the present invention, a communication apparatus can be improved in performance.

6 Claims, 26 Drawing Sheets

SPAN 2.0MHz

SURFACE ACOUSTIC WAVE DEVICE, EQUIPMENT INCLUDING THE SAME WITH ELECTRIC CIRCUIT CONNECTED THERETO AND MEASURING METHOD OF PARAMETERS THEREOF

This is a continuation of application Ser. No. 08/115,740, filed Sep. 3, 1993, now abandoned.

BACKGROUND OF THE INVENTION

The present invention relates to a surface acoustic wave device, an equipment including the same with an electric circuit connected thereto and a measuring method of parameters thereof.

A general construction of a typical conventional surface acoustic wave device includes an interdigital transducer as a portion thereof. The interdigital transducer serves to convert an electric signal into a surface acoustic wave or vice versa. It is usual to use a bidirectional interdigital transducer whose acoustic wave transmitting or receiving efficiency in a forward direction, that is, a direction in which an acoustic wave transmitting object or an acoustic wave receiving object is located, is the same as that in a reverse direction. On the other hand, a unidirectional interdigital transducer whose acoustic wave transmitting or receiving efficiency in the forward direction is higher than that in the reverse direction has been studied in view of reduction of loss.

It has been known that, in a unidirectional interdigital transducer, acoustic reflection of such interdigital transducer in a forward direction is a source of the so-called triple transit echo (TTE) with which undesired phenomenon such as ripple may be introduced into its frequency characteristics and group delay time characteristics. Therefore, acoustic reflection of the interdigital transducer in the forward direction must be suppressed sufficiently.

For the unidirectional interdigital transducer, its structure which is effective in reducing loss may be not always suitable for suppression of TTE. In such case, it is necessary to clearly define structural conditions of the interdigital transducer under which both high directionality, that is, high ratio of acoustic wave transmitting efficiency in forward direction to that in reverse direction, and minimization of TTE are realized.

A surface acoustic wave device is usually evaluated by analyzing an equivalent circuit thereof using admittance matrix elements and scattering matrix elements. For example, IEEE Transaction on Sonics and Ultrasonics, Vol. SU-26, No. 6, p.426–428 discloses an analysis using a mixed matrix (P-matrix) of admittance matrix elements and scattering matrix elements. Nonetheless, it can not be said that a relation between a structure of an interdigital transducer and its acoustic reflection is clearly defined thereby.

Jpn. J. Appl. Phys. Vol. 22(1983), p. 163–164 discloses an acoustic surface wave device and acoustic reflection of an interdigital transducer in a case where there is no internal dissipation of the interdigital transducer. However, there is no report of a device which has an internal dissipation.

A group type unidirectional interdigital transducer structure is reported in Jpn. Electronic Communication Society, Engineering Research Report US75-15, p. 25–30. In this report, structures of reed electrode, referred to as "120° phase type" and "90° phase type" are proposed, in which a Bessel type phase-shifter which requires at least three phase-shifting elements is used as an example of a 90° phase shifter to be used in the 90° phase type transducer.

For a unidirectional interdigital transducer of an acoustic surface wave device, there may be phase shifter circuits required in order to reduce loss which is caused by improvement of directionality thereof. In such case, a peripheral circuit of the acoustic surface wave device may become complicated and/or the device itself may become large in size. Therefore, it is highly desired to provide a novel structure of an interdigital transducer of a surface acoustic wave device including an electric circuit connected thereto, which has an internal dissipation, whose frequency characteristics and group delay time characteristics have minimized ripple and whose loss is very small with minimum number of phase shifters.

SUMMARY OF THE INVENTION

An object of the present invention is, therefore, to provide a novel structure of an acoustic surface wave device including an interdigital transducer and an electric circuit connected thereto and having frequency and group delay time characteristics with restricted ripple by defining conditions under which acoustic reflection of the interdigital transducer is suppressed when there is internal dissipation in the interdigital transducer and/or a peripheral circuit connected thereto.

Another object of the present invention is to provide a novel structure of a low loss acoustic surface wave device including a unidirectional interdigital transducer and having frequency and group delay time characteristics with restricted ripple by defining conditions under which acoustic reflection of the interdigital transducer is suppressed and loss is minimized.

A further object of the present invention is to provide a novel structure of a low loss acoustic surface wave device having a unidirectional interdigital tansducer and a minimum number of phase shifters and having frequency and group delay time characteristics with minimized ripple.

In order to achieve the above objects, the present invention is based on principles to be described.

A condition under which loss of an acoustic surface wave device with an electric circuit connected thereto becomes minimum is Gl/Ga=1, where Ga is radiation conductance of the acoustic surface wave device and Gl is external load conductance or signal source conductance of the electric circuit. In case where there is no internal dissipation, TTE mentioned previously becomes minimum when Gl/Ga=1. On the other hand, when there is internal dissipation in the surface acoustic wave device and/or the electric circuit, the condition under which the TTE becomes minimum is not always Gl/Ga=1. Under the circumstances, the present inventors have derived conditions under which a low loss acoustic surface wave device can be obtained with sufficiently suppressed TTE, by utilizing a scattering matrix as follow:

In an equivalent circuit of a circuit which is a combination of an interdigital transducer of an acoustic surface wave device, which has internal dissipation, and a peripheral circuit connected thereto and which has an acoustic terminal 1 in a forward transmitting or receiving direction, an acoustic terminal 2 in a reverse direction and an electric terminal 3, a value of the following equation is made ⅓ or less:

$$\{\mu\cos\theta_3 - \Gamma\cos\theta_1 + \sqrt{(\Gamma\cos\theta_1 - \mu\cos\theta_3)^2 - \Gamma^2 + (\kappa+1)(2\mu\Gamma\cos\theta_2 + \kappa\alpha_{11} - \mu^2) - \kappa\alpha_{33}}\}/(1+\kappa)$$

where ($\alpha$) is a matrix resulting from a multiplication of a scattering matrix (S) representative of a unidirectional interdigital transducer and a complex conjugate matrix ($S^*$) of the matrix (S), $\kappa(=|S_{23}|^2/|S_{13}|^2)$ is a directionality coefficient, $\theta_1$ is $\arg(s_{13}{}^2 s_{33}{}^* s_{11}{}^*)$, $\theta_2$ is $\arg(\alpha_{13}{}^{*} s_{33} s_{13}{}^*)$, $\theta_3$ is $\arg(\alpha_{13}{}^* s_{13} s_{11}{}^*)$, $\mu$ is $\alpha_{13}/|s_{13}|$ and $\Gamma$ is gamma function.

In case of a unidirectional interdigital transducer whose internal dissipation is as small as negligible, it is possible to obtain a low loss unidirectional interdigital transducer with sufficiently restricted TTE even when geometrical phase difference is other than the conventional "90° phase type" or "120° phase type", by changing $\phi m$, provided that the following equation is satisfied:

$$Pi/Pq=\exp(-j\ \phi m)$$

where Pi is electric power supplied to a reflection electrode, Pq is electric power supplied to a transmitting electrode, $\phi m$ is a geometrical phase difference between the reflecting and transmitting electrodes.

In a transducer pattern of a unidirectional interdigital transducer having no phase-shifter required, a first to sixth fingers having arbitrary length are arranged in parallel on a piezo-electric substrate in the order as a unit. The first to sixth fingers have width of $\lambda/8$, $3\lambda/8$, $\lambda/8$, $\lambda/8$, $\lambda/8$ and $\lambda/8$, respectively, and spaced apart by spaces of $\lambda/8$, $\lambda/8$, $\lambda/4$, $\lambda/4$ and $\lambda/8$, respectively. The first, third, fifth and sixth fingers are connected electrically to one of two terminals of a interdigital transducer to the other of which the second and fourth fingers are connected together electrically. By changing the width of the respective electrode fingers of the interdigital transducer, it is possible to obtain a low loss acoustic surface wave device in which TTE is sufficiently suppressed and which does not require phase-shifter.

With using the above mentioned technique, it is possible to provide a structural condition of an acoustic surface wave device with which TTE thereof is suppressed and thus to minimize ripples on a frequency characteristics and a group delay time characteristics thereof. Further, for a unidirectional interdigital transducer, it is possible to minimize loss, reduce the number of phase-shifters and minimize the size of the device, resulting in a compact, low loss, high performance acoustic surface wave device with minimized ripple.

DETAILED DESCRIPTION OF THE PREFERRED EMBODIMENTS

Figure 1:
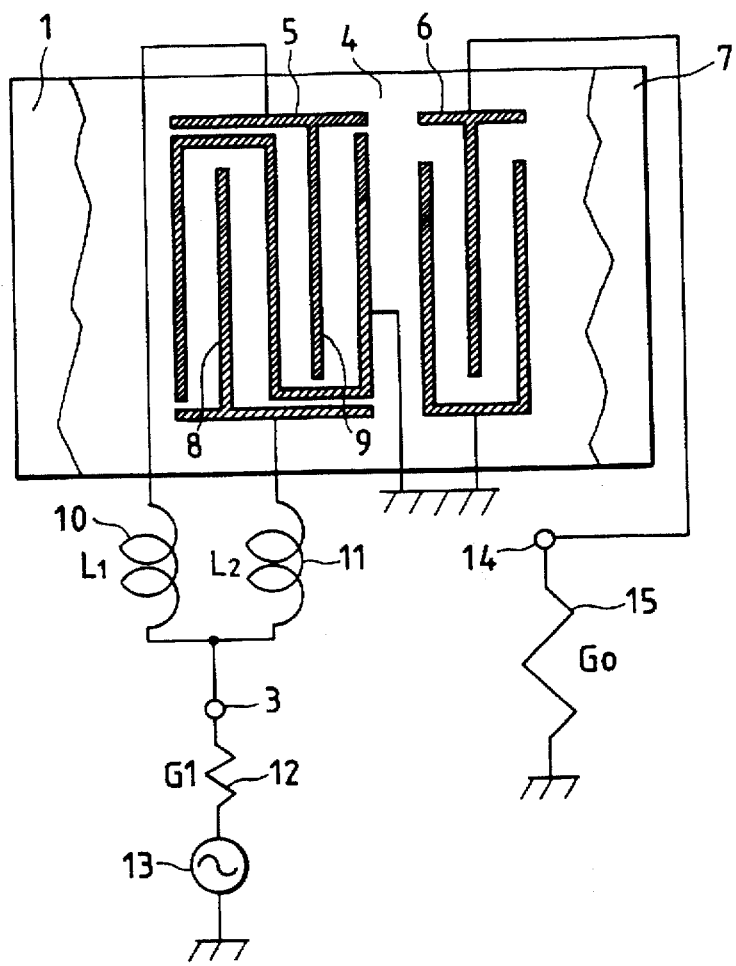
FIG. 1 illustrates a typical example of a surface acoustic wave device having an interdigital transducer according to a first embodiment of the present invention.

FIG. 1 illustrates an surface acoustic wave device including a peripheral circuit, according to a first embodiment of the present invention. In FIG. 1, the surface acoustic wave device comprises an acoustic surface wave substrate 4, a unidirectional input transducer 5 formed thereon, a bidirectional output transducer 6 formed thereof and connected to an output electric terminal 14, acoustic absorbing portions 7 painted on opposite end portions of the substrate 4, for restricting acoustic wave reflected from end faces of the substrate 4. The unidirectional input transducer 5 is composed of fingers 8 and 9 between which a meandering electrode is formed. Phase-shifters 10 and 11 which are in the form of coils L1 and L2 have one ends connected to an input electric terminal 3 and the other ends connected to the fingers 8 and 9, respectively, to form the so-called group type unidirectional interdigital transducer. An electric power source 13 is connected to the input electric terminal 3 through a power source conductance 12. A load conductance 15 is connected to an output electric terminal 14. The acoustic surface wave substrate 4 is usually formed of 128° Y-X LiNbO$_3$ and the various electrodes are formed from aluminum film 1000 to 8000 µm thick.

Figure 2:
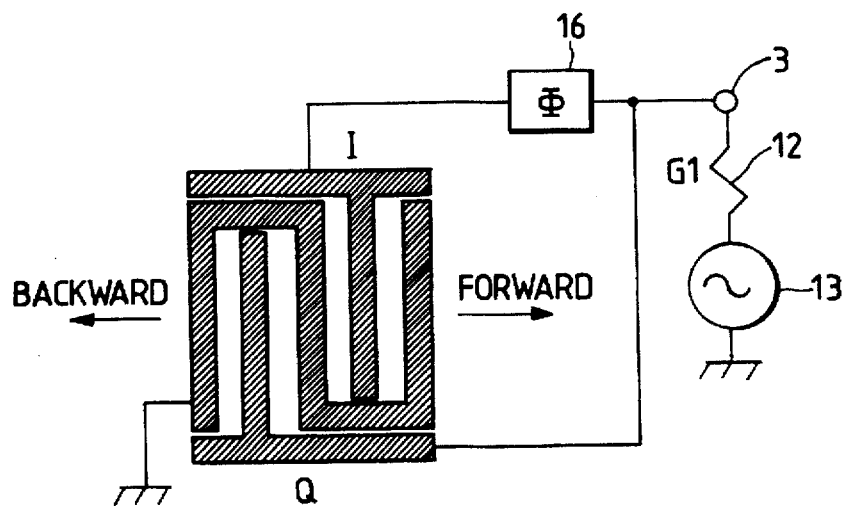
FIG. 2 illustrates a uni-directional transducer pattern according to a second embodiment of the present invention.

FIG. 2 shows a structure of a group type unidirectional interdigital transducer with related electric circuit, according to a second embodiment of the present invention. As shown in FIG. 2, energy is transmitted in one of forward and backward directions depending upon electrical phase difference given by a phase-shifter 16 and geometrical phase difference which depends upon an arrangement of the electrodes. It is defined here that the unidirectional interdigital transducer structure unit shown in FIG. 2 including the phase shifter circuit 16 is represented by an equivalent circuit having forward acoustic terminals 1, 1', backward acoustic terminals 2, 2' and electric terminals 3, 3', as shown in FIG. 4.

Figure 3:
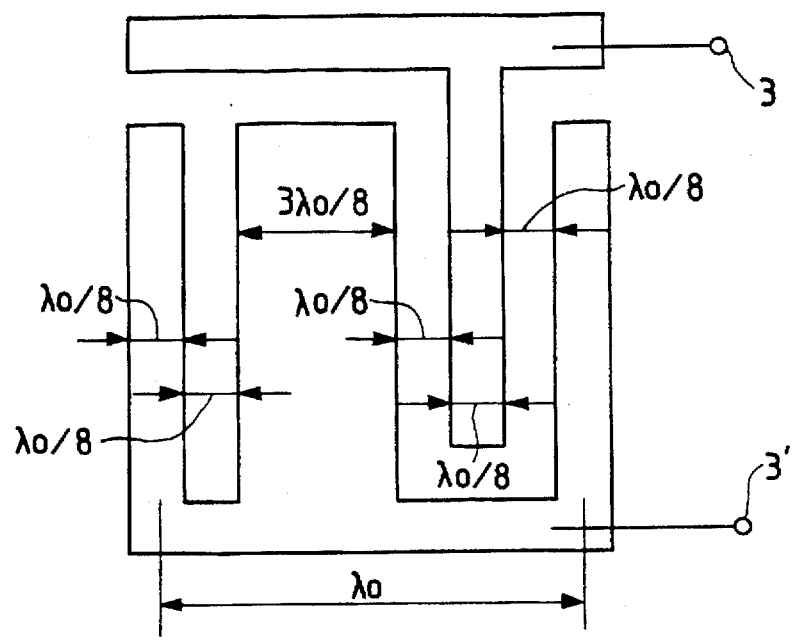
FIG. 3 illustrates an internal reflection type unidirectional interdigital transducer pattern according to a third embodiment of the present invention.

FIG. 3 illustrates a structure of an internal reflection type unidirectional interdigital transducer unit according to a third embodiment of the present invention. The unidirectionality of this structure is realized by cancelling the mass-electrical loading (MEL) which is reflection due to a difference in characteristic impedances for acoustic surface wave between a region of a substrate on which a transducer is formed and another region thereof on which no transducer is formed, and the regenerated wave (RW) which is reflection depending on electric load, each other. In this case, the forward end, the backward end and the electric terminal of the structure are also defined as forward acoustic terminals 1, 1', backward acoustic terminals 2, 2' and electric terminals 3, 3' as in the case shown in FIG. 2. With this definition, it becomes possible to represent any unidirectional transducer which is not always of the group type and may include those of the internal reflection type such as shown in FIG. 3 by the equivalent circuit such as shown in FIG. 4.

Figure 4:
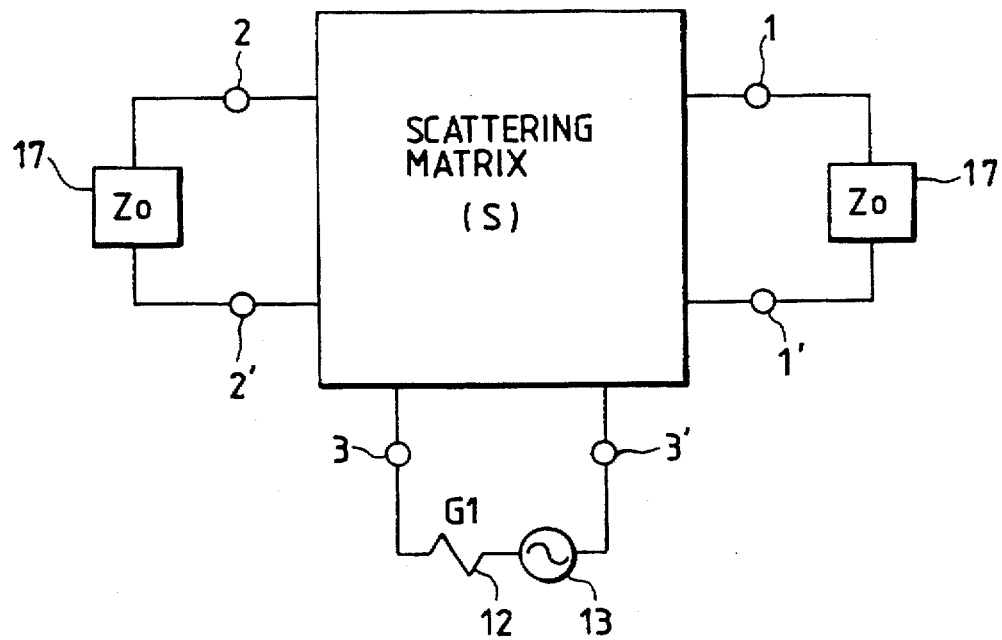
FIG. 4 is an equivalent circuit of the unidirectional interdigital transducer shown in FIG. 2 or 3.

In FIG. 4, characteristics impedances Zo 17 are connected between the forward acoustic terminals 1 and 1' and between the backward acoustic terminals 2 and 2', respectively. It is known that, in the unidirectional interdigital transducer mentioned above, there is internal dissipation such as ohmic loss of the circuit or the electrodes.

For the scattering matrix (S) in the above mentioned circuit, the following relation is established:

$$(S)(S^*) = (\alpha) \quad (1)$$

where (S) and ($\alpha$) are 3 rows×3 columns matrices, respectively.

A case where scattering matrix elements are complex numbers corresponds to a physical case where there is no restriction in frequency and in connecting condition at the electric terminals. From the equation (1) the following three equations are obtained:

$$|s_{11}|^2 + |s_{12}|^2 + |s_{13}|^2 = \alpha_{11} \quad (2)$$

$$|s_{13}|^2 + |s_{23}|^2 + |s_{33}|^2 = \alpha_{33} \quad (3)$$

$$s_{13}s_{11}^* + s_{23}s_{12}^* + s_{33}s_{13}^* = \alpha_{13} \quad (4)$$

From the above three equations, the following equations are obtained:

$$|s_{13}|^2 = (\alpha_{33} - \Gamma^2)/(1 + \kappa) \quad \text{(Forward Direction)} \quad (5)$$

$$|s_{23}|^2 = \kappa(\alpha_{33} - \Gamma^2)/(1 + \kappa) \quad \text{(Backward Direction)} \quad (6)$$

$$|s_{11}|^2 = \quad (7)$$

$$\left\{ \mu\cos\theta_3 - \Gamma\cos\theta_1 + \sqrt{\frac{(\Gamma\cos\theta_1 - \mu\cos\theta_3)^2 - \Gamma^2 +}{(\kappa+1)(2\mu\Gamma\cos\theta_2 + \kappa\alpha_{11} - \mu^2) - \kappa\alpha_{33}}} \right\} /$$

$$(1 + \kappa) \text{(Acoustic Reflection)}$$

where $$\kappa \equiv |s_{23}|^2/|s_{13}|^2 \quad \text{(Directionality Coefficient)} \quad (8)$$

$$\Gamma \equiv |s_{33}| = \sqrt{\frac{[(b-1)^2 + a^2]}{[(b+1)^2 + a^2]}} \quad \text{(Electric Reflection)} \quad (9)$$

$$b \equiv Gl/Ga \quad (10)$$

$$a \equiv Bt/Ga \quad (11)$$

$$\mu \equiv |\alpha_{13}/s_{13}| \quad (12)$$

$$\theta_1 \equiv \arg(s_{13}^2 s_{33}^* s_{11}^*) \quad (13)$$

$$\theta_2 \equiv \arg(s_{33}s_{13}^*) \quad (14)$$

$$\theta_3 \equiv \arg(s_{13}s_{11}^*) \quad (15)$$

where Gl is an external load (or signal source) conductance, Ga is a radiation conductance and Bt is a total susceptance including circuit susceptance. As will be clear, the acoustic reflection represented by the equation (7) is the source of TTE.

In a television receiver, for example, TTE causes ghost failure on an image screen thereof to be occurred and, for audio communication, etc., it is a source of echo disturbance. Since acceptable detection limit of ghost in a television receiver is −30 to −40 dB and acceptable detection limit of disturbance in such audio communication is −20 to −30 dB, the minimum required suppression of TTE can be set to −20 dB. Due to the fact that TTE is reflected twice between an input transducer and an output transducer, an amount of reflection at one of the reed electrodes becomes about one third. Therefore, in view of disturbance characteristics of a device, the minimum required condition is to make the value of the following formula ⅓ or less:

$$\{\mu\cos\theta_3 - \Gamma\cos\theta_1 + \sqrt{(\Gamma\cos\theta_1 - \mu\cos\theta_3)^2 - \Gamma^2 + (\kappa+1)(2\mu\Gamma\cos\theta_2 + \kappa\alpha_{11} - \mu^2) - \kappa\alpha_{33}}\}/(1+\kappa) \leq 1/3$$

where ($\alpha$) is a matrix resulting from a multiplication of a scattering matrix (S) representative of a unidirectional interdigital transducer and a complex conjugate matrix ($S^*$) of the matrix (S), $\kappa(=|S_{23}|^2/|S_{13}|^2)$ is a directionality coefficient, $\theta_1$ is $\arg(s_{13}^2 s_{33}^* s_{11}^*)$, $\theta_2$ is $\arg(\alpha_{13}^* s_{33} s_{11}^*)$, $\theta_3$ is $\arg(\alpha_{13}^* s_{13} s_{11}^*)$, $\mu$ is $\alpha_{13}/|s_{13}|$ and $\Gamma$ is gamma function. In the first embodiment, the value of the equation (16) is set to ⅒, resulting in an acoustic surface wave device having satisfactory characteristics with well suppressed TTE.

When the imaginary part at the electric terminal 3 of the interdigital transducer is cancelled out at main response frequency thereof, the following results are obtained:

$$a = 0 \quad (17)$$

$$\theta_1 = \theta_2 = \theta_3 = 0 \quad (18)$$

since the scattering matrix elements are real numbers. Therefore, from the equations (5) to (7), the following equations are obtained:

$$s_{13}^2 = (\alpha_{33} - \gamma^2)/(1 + \kappa) \quad \text{(Forward Direction)} \quad (19)$$

$$s_{23}^2 = \kappa(\alpha_{33} - \gamma^2)/(1 + \kappa) \quad \text{(Backward Direction)} \quad (20)$$

$$s_{11} = \{\mu - \gamma + \sqrt{\kappa(2\mu\gamma + \alpha_{11} + \kappa\alpha_{11} - \alpha_{33} - \mu^2)}\}/ \quad (21)$$

$$(\kappa + 1) \text{ (Acoustic Reflection)}$$

$$\kappa \equiv s_{23}^2/s_{13}^2 \quad \text{(Directionality Coefficient)} \quad (22)$$

$$\gamma \equiv s_{33} = (b - 1)/(b + 1) \quad \text{(Electric Reflection)} \quad (23)$$

$$\mu \equiv \alpha_{13}/s_{13} \quad (24)$$

Therefore, by setting the value of the formula $$\{\mu - \gamma + \sqrt{\kappa(2\mu\gamma + \alpha_{11} + \kappa\alpha_{11} - \alpha_{33} - \mu^2)}\}/(\kappa + 1) \quad (25)$$

to ⅓ or less as mentioned previously, the acoustic reflection can be suppressed.

In the second embodiment, the value of the formula (25) was set to ⅒, with the imaginary part of the electric terminal at the center frequency being cancelled. According to these embodiment, an acoustic surface wave device having satisfactory flatness within the passband was obtained.

Figure 5:
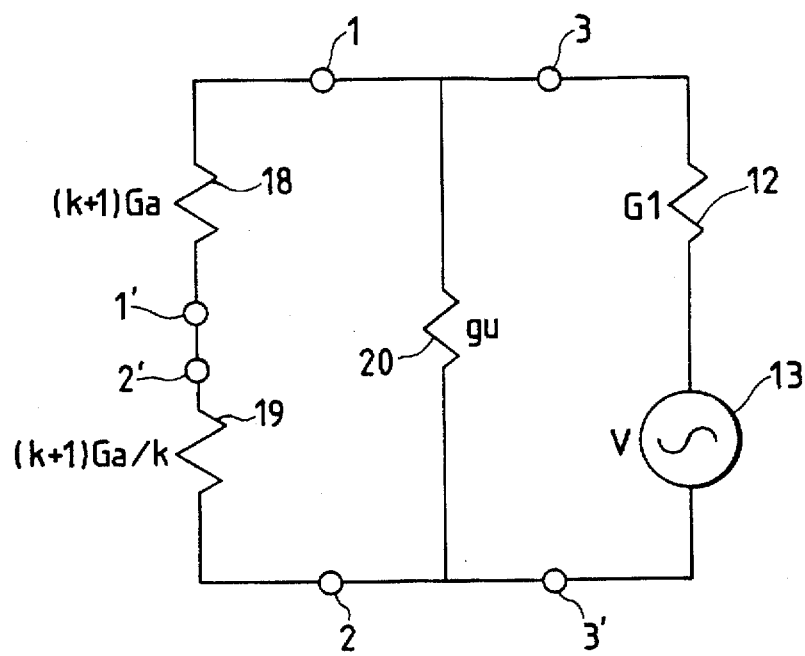
FIG. 5 is a parallel type equivalent circuit of the circuit shown in FIG. 4 which includes internal dissipation.
Figure 6:
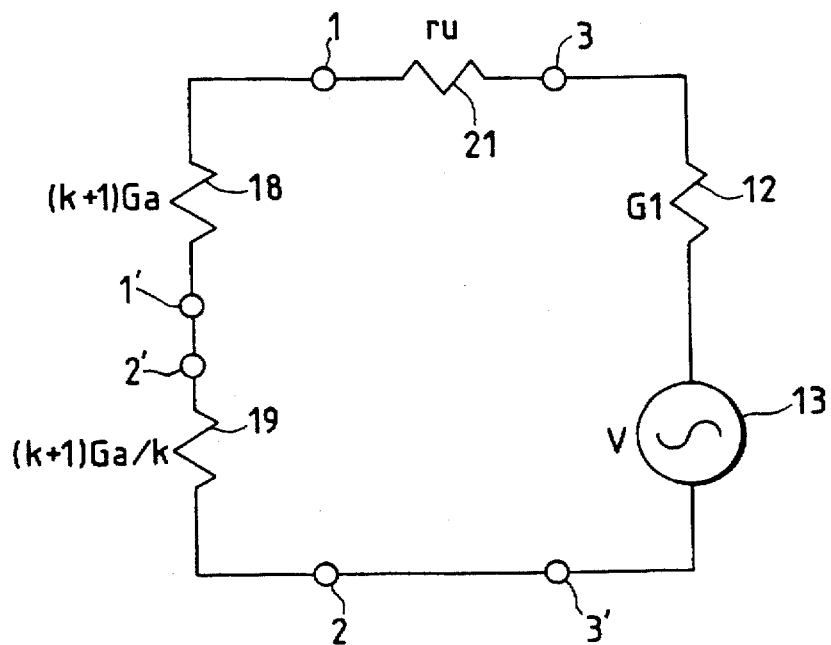
FIG. 6 is a series type equivalent circuit of the circuit in FIG. 4 which includes internal dissipation.

In these cases, it has been found that the surface acoustic wave devices including the electric circuits can be represented by simple equivalent circuits such as shown in FIGS. 5 and 6. FIG. 5 shows a parallel type equivalent circuit thereof in which internal dissipation is represented by parallel conductance gu 20 and FIG. 6 is a series type equivalent circuit in which the internal dissipation is represented by series resistance ru 21. In these figures, the forward radiation conductance 18 and the backward radiation conductance 19 are represented by $(\kappa+1)Ga$ and $(\kappa+1)Ga/\kappa$, respectively.

When the equivalent circuit shown in FIG. 5 is used, the acoustic reflection $s_{11}$ and the insertion loss $s_{13}$ are represented by the following equations, respectively:

$$s_{11} = \{[(\kappa - 1)/(\kappa + 1)](Gl + gu) + Ga\}/(Ga + Gl + gu) \quad (26)$$

$$s_{13} = \sqrt{1/(\kappa+1)} \cdot 2\sqrt{GaGl}/(Ga + Gl + gu) \quad (27)$$

Further, by using the previously mentioned b and $$g = gu/Ga \quad (28)$$

the acoustic reflection and the insertion loss are represented as follows:

$$s_{11} = \{[(\kappa - 1)/(\kappa + 1)](b + g) + 1\}/(1 + b + g) \quad (29)$$

$$s_{13} = \sqrt{1/(\kappa+1)} \cdot 2\sqrt{b}/(1 + b + g) \quad (30)$$

Similarly, by making an absolute value of the following formula related to the acoustic reflection ⅓ or less:

$$\{[(\kappa-1)/(\kappa+1)](b+g)+1\}/(1+b+g) \quad (31)$$

a satisfactory characteristics is obtained.

When the equivalent circuit shown in FIG. 6 is used, the acoustic reflection $s_{11}$ and the insertion loss $s_{13}$ are represented by the following equations, respectively:

$$s_{11} = \{[(\kappa - 1)/(\kappa + 1)](1/Ga) + ru + 1/Gl\}/[(1/Ga) + ru + (1/Gl)] \quad (32)$$

$$s_{13} = \sqrt{1/(\kappa+1)} \cdot \{(2/\sqrt{GaGl})/[(1/Ga) + (1/Gl) + ru]\} \quad (33)$$

Further, by using b and $$r = ru \cdot Ga = ru/Ra \quad (34)$$

they are represented as follows:

$$s_{11} = \{[(\kappa - 1)/(\kappa + 1)] + (1/b) + r\}/[1 + (1/b) + r] \quad (35)$$

$$s_{13} = \sqrt{1/(\kappa+1)} \cdot \{(2/\sqrt{b})/[1 + (1/b) + r]\} \quad (36)$$

Similarly, by making an absolute value of the following formula related to the acoustic reflection ⅓ or less:

$$\{[(\kappa-1)/(\kappa+1)]+(1/b)+r\}/[1+(1/b)+r] \quad (37)$$

a satisfactory characteristics is obtained. The above values in dB are as follows:

$$P_{11} = 20 \log(S_{11}) \quad (38)$$

$$P_{13} = 20 \log(S_{13}) \quad (39)$$

Figure 7:
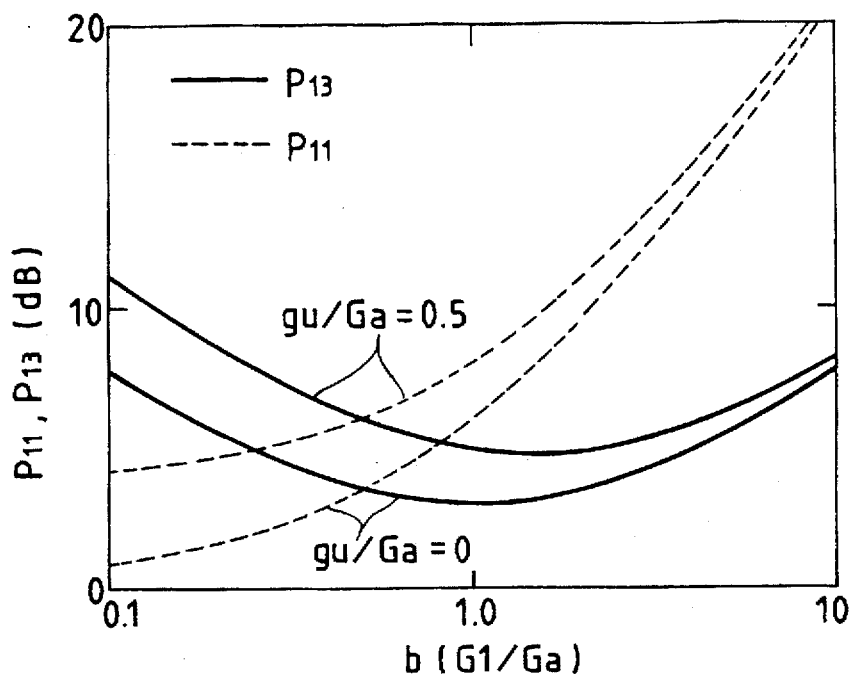
FIG. 7 is a graph showing a relation between normalized conductance, insertion loss and acoustic reflection for a bidirectional interdigital transducer ($\kappa=1$) having internal dissipation and represented by the parallel type equivalent circuit.
Figure 8:
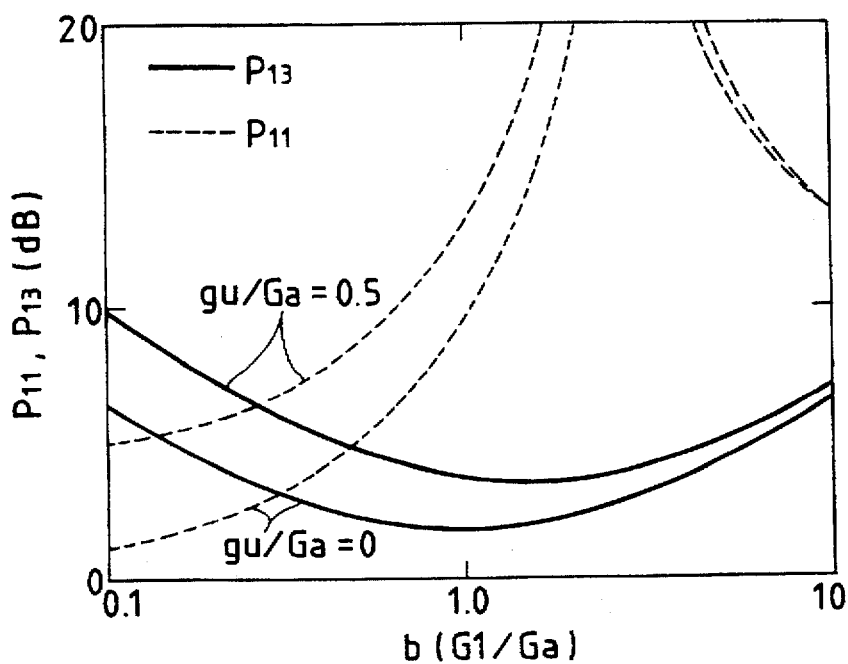
FIG. 8 is a graph showing a relation between normalized conductance, insertion loss and acoustic reflection for an incomplete unidirectional interdigital transducer ($\kappa=0.5$) having internal dissipation and represented by the parallel type equivalent circuit.
Figure 9:
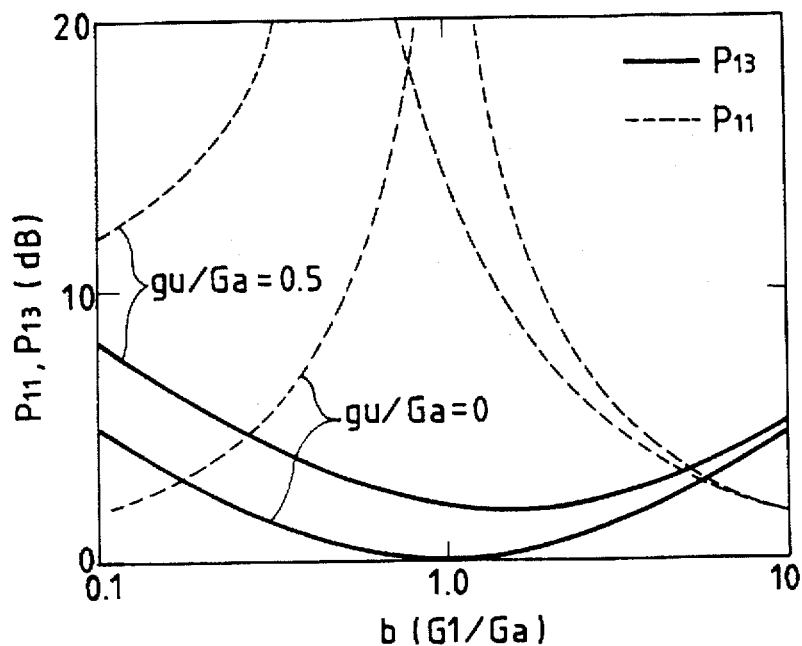
FIG. 9 is a graph showing a relation between normalized conductance, insertion loss and acoustic reflection for a complete unidirectional interdigital transducer ($\kappa=0$) having internal dissipation and represented by the parallel type equivalent circuit.

FIGS. 7 to 12 show calculations of $P_{11}$ and $P_{13}$ on some examples with b(Ga/Gl) being parameter, in which FIGS. 7 to 9 are devices whose internal dissipation is represented by the parallel type. FIG. 7 is for a bi-direction interdigital transducer ($\kappa=1$), FIG. 8 is for an incomplete unidirectional interdigital transducer ($\kappa=0.5$) and FIG. 9 is for a complete unidirectional interdigital transducer ($\kappa=0$). In these figures, a solid curve shows the insertion loss and a dotted curve shows the acoustic reflection suppression. In general, when there is internal dissipation (gu/Ga=0.5), minimum loss point is shifted right, that is, the side in which Gl/Ga is larger, and the acoustic reflection suppression point is shifted left, that is, Gl/Ga is smaller.

Figure 10:
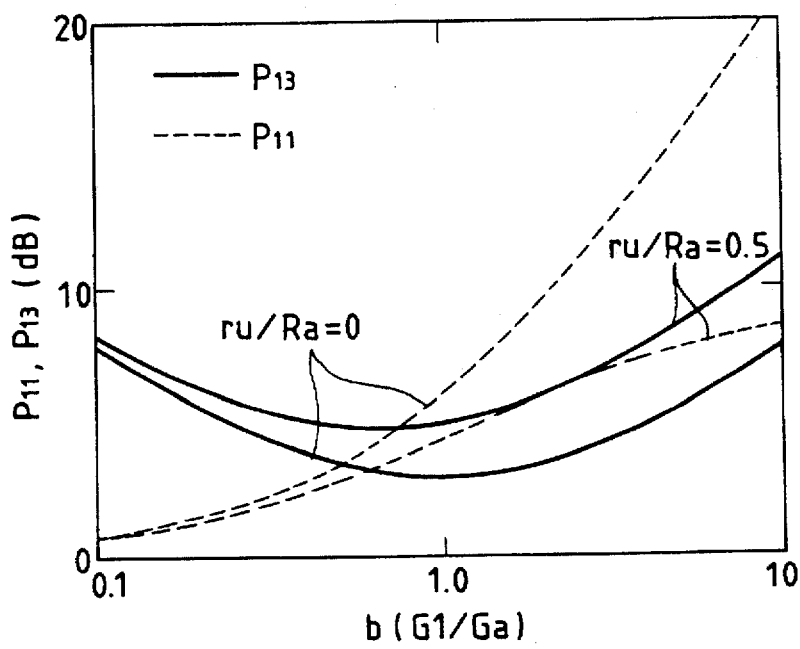
FIG. 10 is a graph showing a relation between normalized conductance, insertion loss and acoustic reflection for a bidirectional interdigital transducer ($\kappa=1$) having internal dissipation and represented by the series type equivalent circuit.
Figure 11:
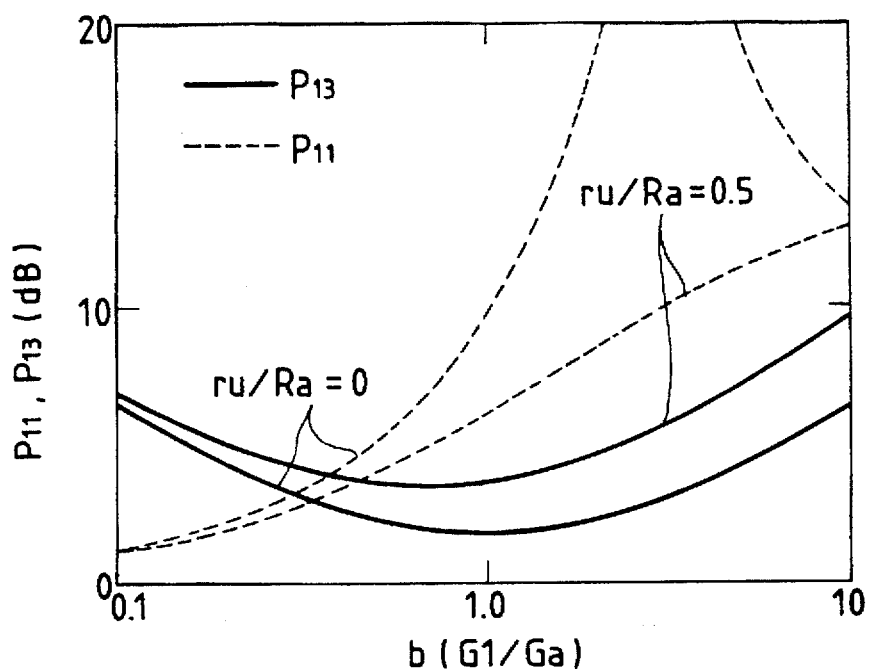
FIG. 11 is a graph showing a relation between normalized conductance, insertion loss and acoustic reflection for an incomplete unidirectional interdigital transducer ($\kappa=0.5$) having internal dissipation and represented by the series type equivalent circuit.
Figure 12:
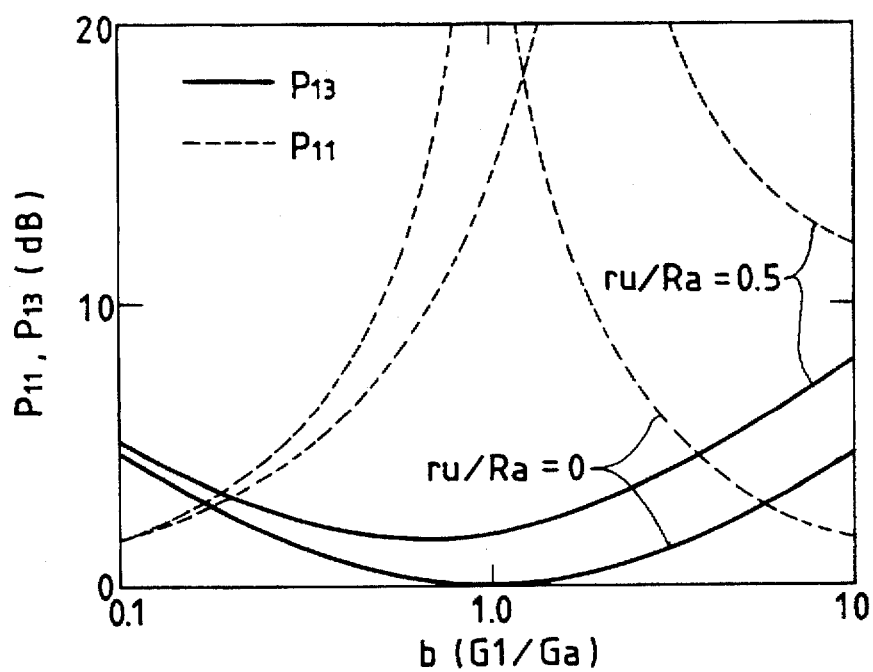
FIG. 12 is a graph showing a relation between normalized conductance, insertion loss and acoustic reflection for a complete unidirectional interdigital transducer ($\kappa=0$) having internal dissipation and represented by the series type equivalent circuit.

FIGS. 10 to 12 show calculations of $P_{11}$ and $P_{13}$ on some examples of devices whose internal dissipation is represented by the series type, with b(Ga/Gl) being parameter. FIG. 10 is for a bidirection interdigital transducer ($\kappa=1$), FIG. 11 is for an incomplete unidirectional interdigital transducer ($\kappa=0.5$) and FIG. 12 is for a complete unidirectional interdigital transducer ($\kappa=0$). In these figures, a solid curve shows the insertion loss and a dotted curve shows the acoustic reflection suppression. In general, when there is internal dissipation (gu/Ga=0.5), minimum loss point is shifted left, that is, the side in which Gl/Ga is smaller, and the acoustic reflection suppression point is shifted right, that is, Gl/Ga is larger.

In a usual circuit including reed electrodes, a component of dissipation of the equivalent circuit is 5% or more. Therefore, $r \geq 0.05$ and $g \geq 0.05$. Thus, in a case where the internal dissipation is represented by FIG. 6, a condition under which the acoustic reflection suppression becomes maximum is obtained by making the value of the equation (35) zero, resulting in the condition of b equal to or larger than 1.05 for $0 \leq \kappa \leq 1$.

For the case of complete uni-directionality ($\kappa=0$) in which internal dissipation is the parallel type shown in FIG. 5, the condition becomes b<0.95.

According to the third embodiment in which internal dissipation is represented as in FIG. 5, a satisfactory acoustic reflection characteristics was obtained with $\kappa=0$, $r=0.5$ and $b=0.5$. Further, according to the fourth embodiment, a satisfactory acoustic reflection characteristics was obtained when $\kappa=0$ (complete unidirectionality), $r=0.5$ and $b=2.0$, with the internal dissipation shown in FIG. 6. As is clear from FIGS. 9 and 12, the region in which acoustic reflection is suppressed is expanded by intentionally increasing the internal dissipation (g, r) from 0 to 0.5 and therefore variation of characteristics due to variation of values of acoustic surface wave element and peripheral elements is minimized.

Figure 13:
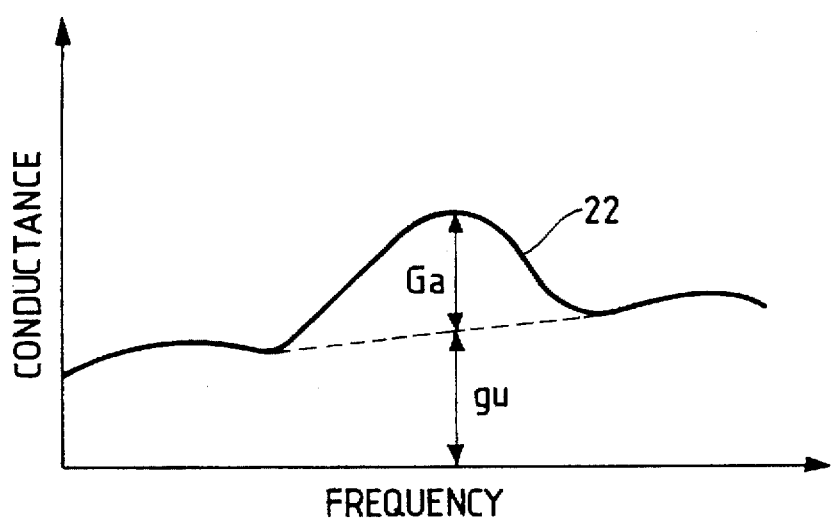
FIG. 13 shows a frequency characteristics of conductance of an interdigital transducer having internal dissipation.
Figure 14:
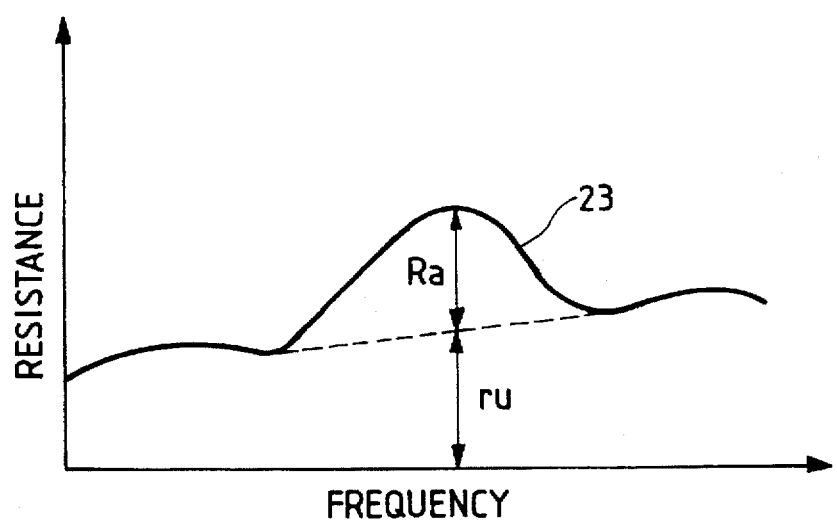
FIG. 14 shows a frequency characteristics of resistance of an interdigital transducer having internal dissipation.

Although, in the above mentioned embodiments, values of conductance (or resistance) related to the internal dissipation are known because these are inserted intentionally, there is an internal dissipation in elements and a practical circuit which has no intentionally inserted internal dissipation, necessarily. Therefore, in order to obtain an acceptable acoustic reflection suppressing characteristics, it is necessary to know a value of conductance or resistance related to internal dissipation. FIGS. 13 and 14 show a conductance-frequency characteristics 22 of an interdigital transducer including a peripheral circuit and a resistance-frequency characteristics 23 of an interdigital transducer including a peripheral circuit, respectively. It is possible to obtain a constant related to internal dissipation from a value of conductance or resistance at an extreme frequency and a value thereof at a main response frequency. According to this embodiment, it is possible to obtain an acceptable acoustic reflection suppressing characteristics even when there is no intentional internal dissipation.

The inventors have found that the coefficient related to internal dissipation of a reed electrode can be represented as follow:

$$\alpha_{33} = \alpha_0 + \sum_{m=1}^{\infty} \beta_m^+ |1+S_{33}|^{2m} + \sum_{m=1}^{\infty} \beta_m^- |1-S_{33}|^{2m} \quad (40)$$

When conductor loss (for example, loss in phase-shifter, etc.) in a circuit is large, contribution of the first term, that is, $1+S_{33}$ or $1-S_{33}$, becomes large. When internal dissipation is represented by the equivalent circuit shown in FIG. 5, $\alpha_{33}$ becomes as follow:

$$\alpha_{33} = 1 - ruGl\,|1+S_{33}|^2 = 1 - \beta_1^+|1+S_{33}|^2 \quad (41)$$

When it is represented by FIG. 6, it becomes as follow:

$$\alpha_{33} = (1 - gu/Gl)\,|1+S_{33}|^2 \sim 1 - \beta_1^-|1+S_{33}|^2 \quad (42)$$

In this case, ass is represented as follow:

$$\alpha_{33} = \alpha_0 - \beta_1|1-S_{33}e^{j\xi}|^2 \quad (43)$$

where $\xi$ includes meanings of a sign before $S_{33}$ and correction coefficient of measured phase error.

Figure 15:
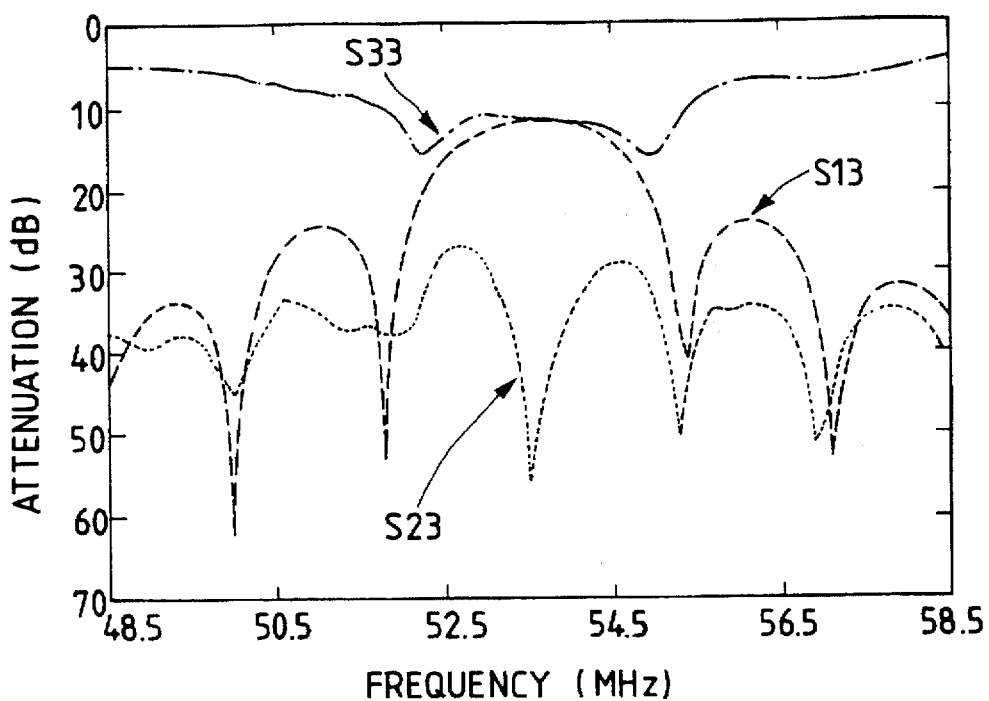
FIG. 15 shows a measurement of scattering matrix elements of a unidirectional interdigital transducer.
Figure 16:
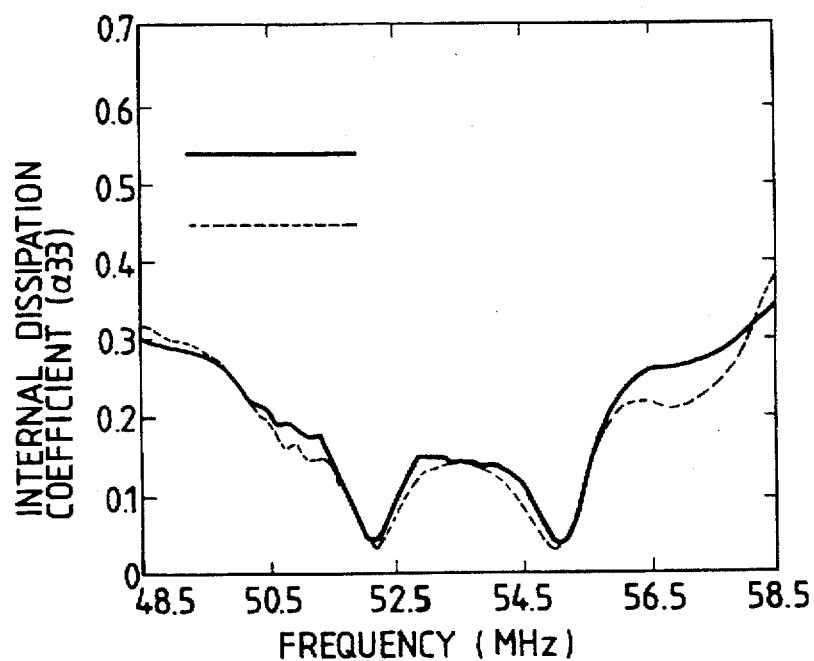
FIG. 16 is a frequency characteristics of internal dissipation coefficient of a unidirectional interdigital transducer.

The inventors have conducted experiments to confirm the above matters by using a structure including 15 electrode groups each including a pair of electrodes without weighting, which is formed on a X-112° LiTaO$_3$ substrate and having center frequency of 53.5 MHz and opening of 1000 μm. The forward and backward characteristics were measured by arranging monitor electrodes each having small number of electrode pairs in the respective directions. FIG. 15 shows a result of the measurement. In FIG. 15, the internal dissipation scattering matrix element was obtained by using the equation (15). A result is shown in FIG. 16 by a dotted line. As shown in FIG. 16, it indicates a large frequency dependency. Then, $\alpha_{33}$ was obtained from electric reflection $S_{33}$ by using the equation (43). In this case, constants $\alpha_0$, $\beta_1$ and $\xi$ were obtained by fitting with the experimental values at first zero point frequencies 52 MHz and 55 MHz and a second zero point frequency 50 MHz, at which influence on radiation characteristics is small. The result was $\alpha_0 = 0.41$, $\beta_1 = 0.5$ and $\xi = 117°$. The solid line in FIG. 16 shows a result of calculation of the equation (22).

Figure 17:
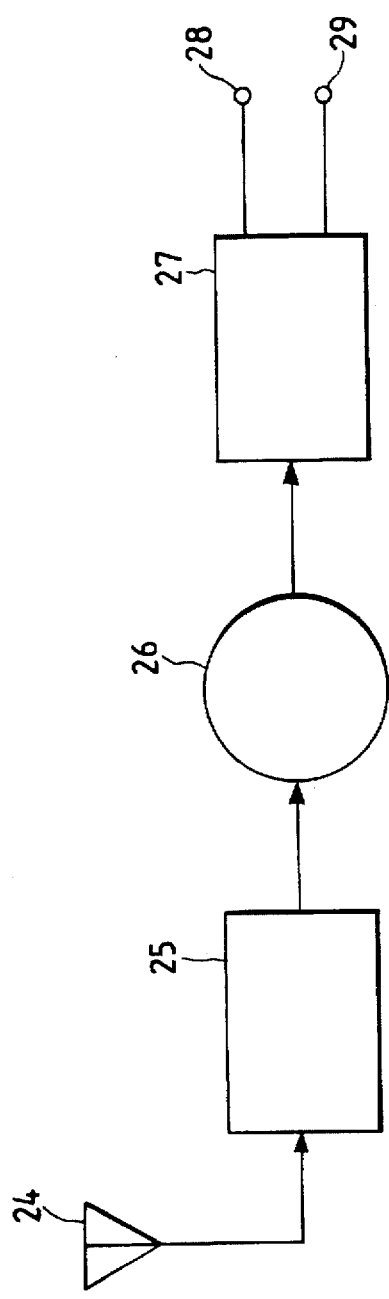
FIG. 17 is a system block diagram of a television receiver having a surface acoustic wave device according to a fourth embodiment of the present invention.

FIG. 17 is a block diagram of a television receiver system using an acoustic surface wave device according to a fourth embodiment of the present invention. In FIG. 17, a signal input through an antenna 24 is converted by a tuner portion 25 into an intermediate frequency (IF) which passes through the acoustic surface wave device 26 of the present invention and is demodulated by a demodulating portion 27. A video signal portion of the demodulated signal is output at a terminal 28 and an audio signal portion thereof is output at a terminal 29. Since the present acoustic surface wave device 26 is used as an intermediate frequency filter, an IF circuit whose group delay time is highly flat and whose detection linearity is high can be realized. As a result, the television receiver has a superior demodulation characteristics.

Figure 18:
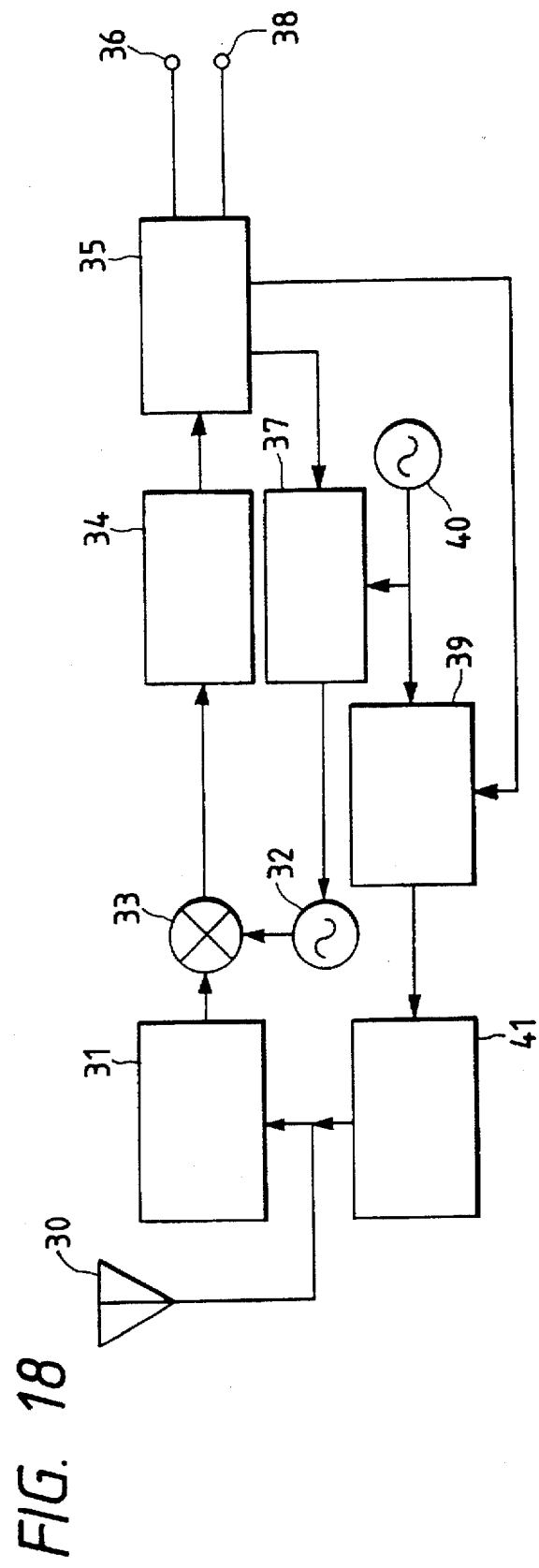
FIG. 18 is a system block diagram of a mobile communication terminal having surface acoustic wave device according to a fifth embodiment of the present invention.

FIG. 18 is a block diagram of a mobile telephone system using an acoustic surface wave device according to a fifth embodiment of the present invention. In FIG. 18, a signal input through an antenna 30 is passed through a first stage receiving filter 31 and mixed, in a mixer 33, with a signal sent from a voltage variable oscillator 32 and then a signal of one channel is selected by an intermediate frequency filter 34 using a unidirectional interdigital transducer according to the present invention. The signal selected is converted by a demodulator/logic circuit 35 into an audio signal and output at an audio output terminal 36. On the other hand, a reference signal for converting an intermediate frequency is supplied from the demodulator/logic circuit 35 to a control circuit 37 of the voltage variable oscillator 32. At the same time, an audio signal from an audio input terminal 38 is passed through through demodulator/logic circuit 35 to a modulator circuit 39. The audio signal is modulated in the modulator circuit 39 with a modulating signal supplied from a voltage variable oscillator 40. The modulated signal is passed through a transmitting filter 41 and transmitted through the antenna. A control signal is sent from the voltage variable oscillator 40 to a receiving control circuit 37 to synchronize the the latter and the modulator 39. Since the intermediate frequency filter 34 is low loss and flat in group delay time, the mobile telephone is of high performance providing high sensitivity and highly linear demodulation characteristics.

Now, geometrical condition of constitutional elements of a unidirectional interdigital transducer will be obtained.

As mentioned previously, the TTE suppressing condition for a unidirectional acoustic surface wave device is obtained by inserting κ=0 to the equations (31) and (37). Therefore, the TTE suppressing condition for a complete unidirectional interdigital transducer whose internal dissipation is as small as negligible becomes as follow:

$$b = 1 \quad (44)$$

where $b = Gl/Ga$.

Figure 19:
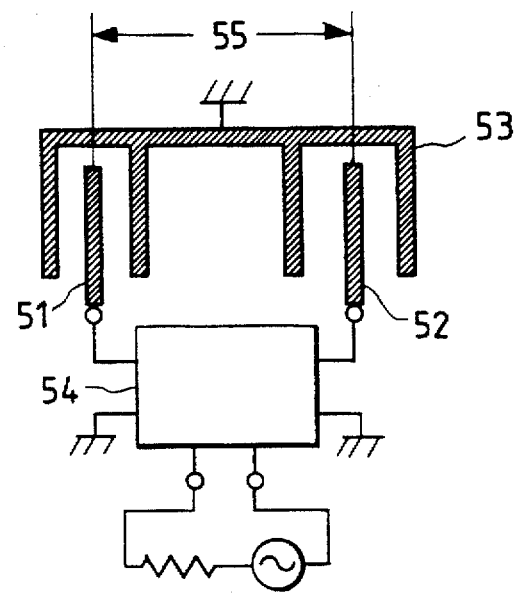
FIG. 19 shows a construction of a group type unidirectional transducer according to a sixth embodiment of the present invention.

A constitutional condition of a complete unidirectional interdigital transducer of the group type such as shown in FIG. 19 which is a sixth embodiment of an acoustic surface wave device according to the present invention will be obtained by using scattering matrix, when geometrical phase difference between transmitting and reflecting electrodes is not an odd multiple of π/2.

In FIG. 19, the device is composed of a transmitting electrode 51, a reflecting electrode 52, a meandering electrode 53, all of which are formed on a piezoelectric substrate, and an electric circuit 54 which includes a phase-shifter for providing an electrical phase difference between the transmitting and reflection electrodes, as usual.

Figure 20:
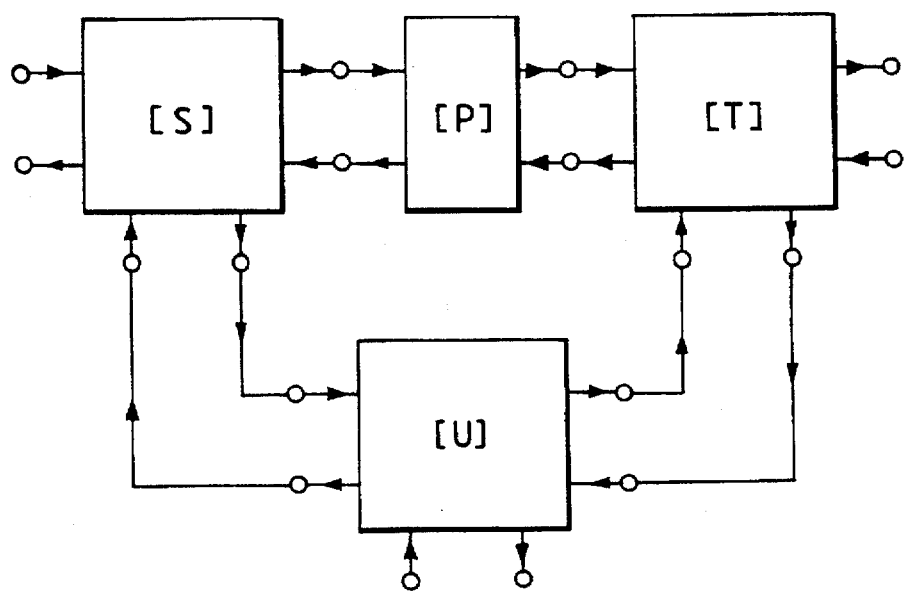
FIG. 20 is an equivalent circuit of the transducer represented by scattering matrix.

FIG. 20 is an equivalent circuit of the device shown in FIG. 19 as a connection of n-terminal circuits represented by scattering matrix. In FIG. 20, S depicts the transmitting electrode, T the reflecting electrode, U the electric circuit and P a propagation path of acoustic surface wave between the transmitting and reflecting electrodes.

The constitutional condition of the device shown by the equivalent circuit in FIG. 20 is derived under the following conditions:

First conditions related to the transmitting and reflecting electrodes:

(a) reciprocity between the respective terminals;

(b) symmetricity between the acoustic terminals; and (c) unitarity of scattering matrix, Second conditions related to the electric circuit:

(a) reciprocity between the respective terminals; and (b) matching of a power source and the terminal 3, Third conditions related to the propagation path:

(a) there is no reflection;

(b) there is no propagation loss.

As a fourth condition, a frequency region of the acoustic surface wave device is set to in the neighbourhood of a center frequency of propagation.

The third conditions (a) and (b) are to handle an actual acoustic surface wave device approximately.

The constructive condition of a complete unidirectionality of the group type unidirectional interdigtal transducer derived by using these conditions while considering interaction between the sending electrode and the reflecting electrode becomes as follow:

$$Pi/Pq = \exp(-j\phi m) \quad (45)$$

where Pi is electric power supplied to the reflecting electrode, Pq is electric power supplied to the sending electrode, exp is the base of natural logarithm, j is unit of imaginary number and $\phi m$ is geometrical phase difference between the reflecting electrode and the sending electrode and $\phi m \neq (180° \cdot n)$, where n is an integer.

Figure 21:
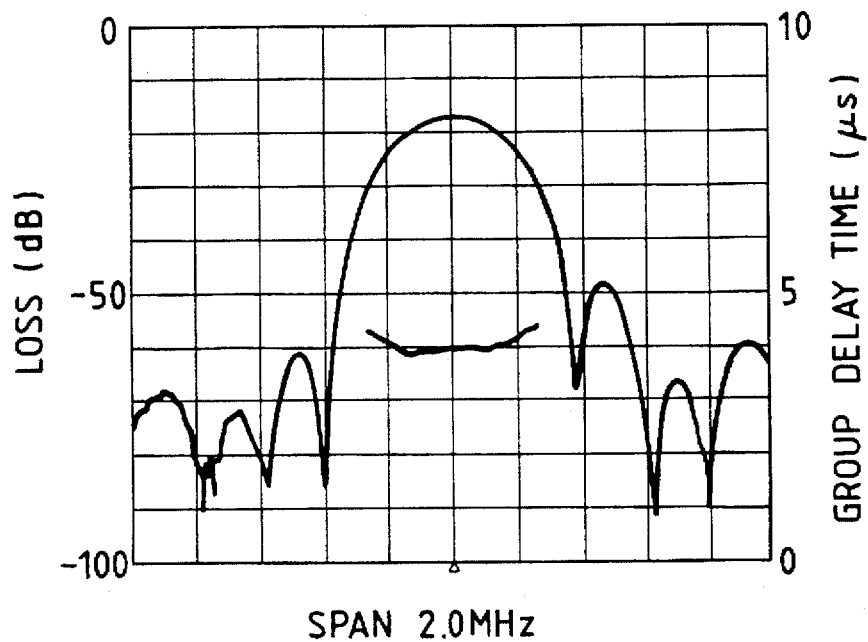
FIG. 21 is a graph showing a frequency characteristics and group delay time characteristics of a surface acoustic wave filter.

FIG. 21 shows an example of frequency characteristics and group delay time characteristics of an acoustic surface wave filter according to a seventh embodiment of the present invention.

This filter was prepared by deposition of an aluminum film 0.5 μm thick on a substrate of ST cut quartz and forming interdigital transducers by suitably etching the aluminum film.

A group type unidirectional interdigital transducer composed of 160 electrode groups and having geometrical phase difference of $4\pi/3$ was used as an input transducer and weighted bidirectional transducer composed of 190 electrode pairs was used as an output transducer.

Figure 22:
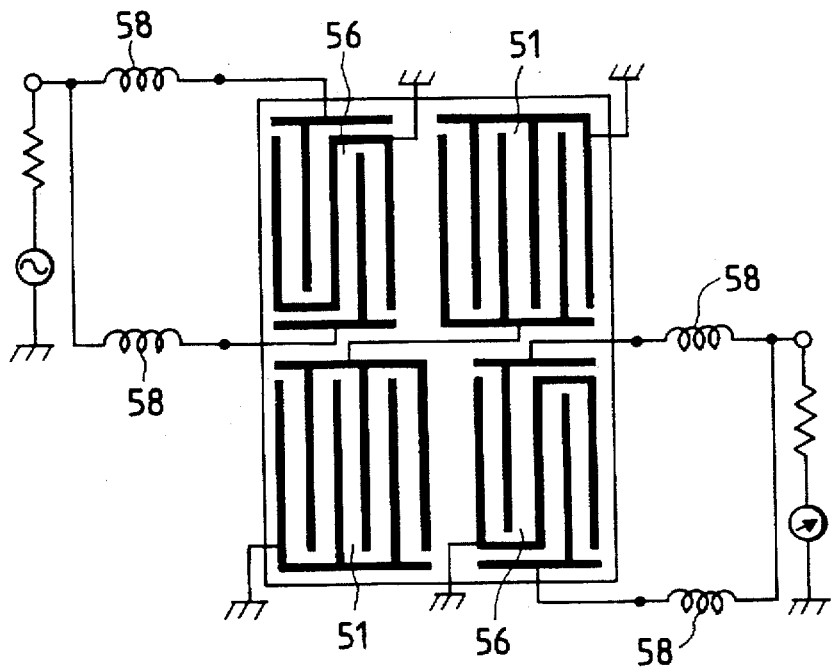
FIG. 22 shows a construction of a surface acoustic filter according to a seventh embodiment of the present invention.

FIG. 22 shows an example of a construction of a surface acoustic wave device according to a seventh embodiment of the present invention, schematically.

The construction shown in FIG. 22 is constituted with group type unidirectional interdigital transducer 56, bidirectional interdigital transducer 57, phase shifter elements (coils) 58 and power sources.

By applying the condition represented by the equation (44) to the unidirectional interdigital transducer 56 on the input side, component caused by TTE, particularly, RW thereof can be restricted sufficiently.

As a result, the surface acoustic wave filter in which there is no ripple within signal pass-band and group delay time deviation (ripple of delay time deviation) is sufficiently restricted is realized as shown in FIG. 21.

The constitutional conditions represented by the equation (44) is applicable to not only the substrate and electrode construction of the seventh embodiment but also other substrates and unidirectional interdigital transducer constructions.

Figure 23:
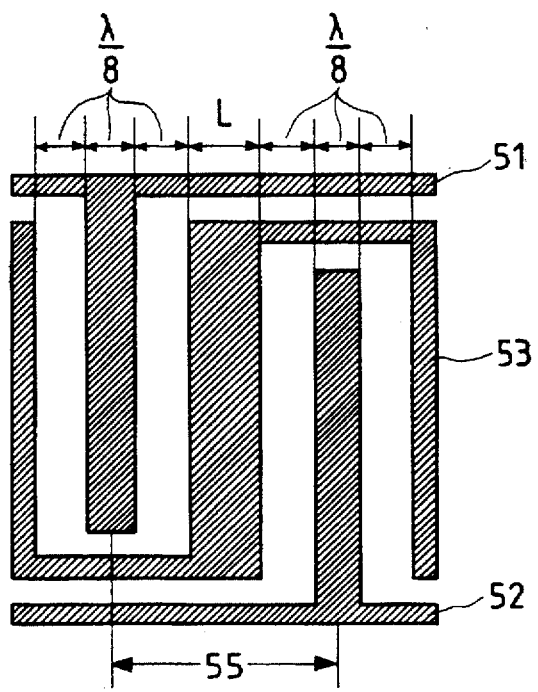
FIG. 23 shows an electrode pattern of a group type unidirectional transducer according to an eighth embodiment of the present invention.

FIG. 23 shows an electrode pattern of a surface acoustic wave device according to a eighth embodiment of the present invention, which is constituted with a sending electrode 51, a reflecting electrode 52 and a meandering electrode 53. There is a geometrical phase difference 55 between the sending electrode 51 and the reflecting electrode 52. The electrode of this embodiment is a group type uni-directional interdigital transducer.

$\lambda$ depicts wavelength of surface acoustic wave at a center frequency of a signal pass-band.

In this embodiment, the geometrical phase difference between the sending and reflecting electrodes can be set at any value by changing width L of the meandering electrode 3 in FIG. 23.

As shown by the equation (45), there is no specific restrictive condition for geometrical phase difference and width of finger of the sending and reflecting electrodes may be any amount so long as the electrode structure satisfies the equation (45).

By using this electrode pattern in a portion or a whole of each transducer of the surface acoustic wave device and arranging respective electrodes such that they satisfy the condition defined by the equation (44), component of TTE which may be caused by RW can be restricted, so that it is possible to reduce ripple within the signal pass-band and restrict group delay time deviation.

Figure 24:
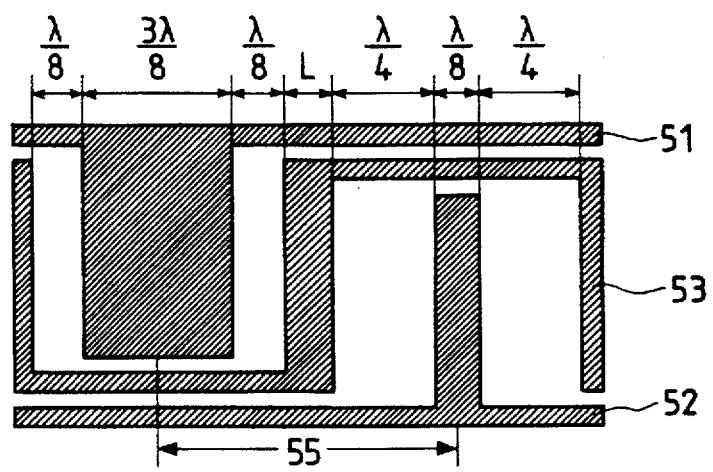
FIG. 24 shows an electrode pattern of a group type unidirectional transducer according to a ninth embodiment of the present invention.

FIG. 24 shows another electrode pattern of a surface acoustic wave device according to a ninth embodiment of the present invention.

Also, in this embodiment, the electrode pattern is constituted with a sending electrode 51, a reflecting electrode 52 and a meandering electrode 53. L depicts a width of the meandering electrode and 55 depicts a geometrical phase difference between the sending and reflecting electrodes.

This electrode pattern indicates a group of unidirectional electrodes which is designed such that the condition defined by the equation (45) which is derived from the equation (44) is satisfied.

The condition defined by the equation (45) can realize a complete unidirectionality with only one phase-shifter element by making absolute values of respective admittances of the sending electrode and the reflecting electrode different when L is set to a suitable value since there is no restrictive condition in geometrical phase difference between the both electrodes.

By using this electrode pattern as a portion or a whole portion of each transducer of a surface acoustic wave device to reduce component of TTE which is caused by RW and restrict group delay time deviation, it is possible to provide a surface acoustic wave device having a single phase-shifter element, which can reduce ripple within the signal pass-band and restrict group delay time deviation. Also, in this case, width L of respective electrode fingers of the sending and reflecting electrodes can be arbitrarily selected so long as the equation (45) is satisfied by it.

Figure 25:
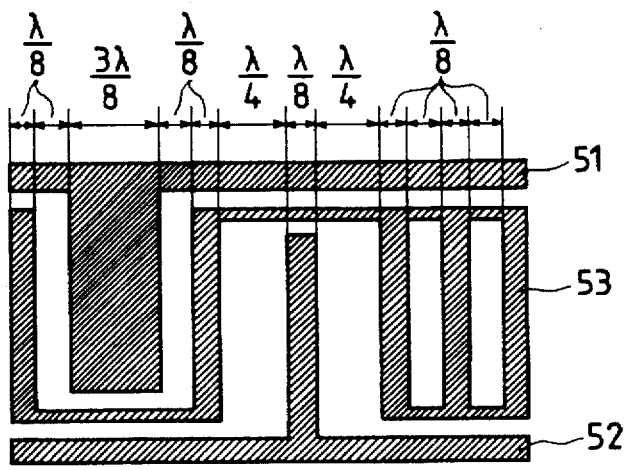
FIG. 25 shows an electrode pattern of a group type unidirectional transducer according to a tenth embodiment of the present invention.

FIG. 25 shows an electrode pattern of a surface acoustic wave device according to a tenth embodiment of the present invention.

Also, in this embodiment, the electrode pattern is constituted with a sending electrode 51, a reflecting electrode 52 and a meandering electrode 53. This electrode pattern is similar to that shown in FIG. 24 except that a right side portion of the meandering electrode 53 has two openings as an inductive electrode pattern.

This electrode pattern indicates a group of unidirectional interdigital transducer which is designed such that the condition defined by the equation (45) which is derived from the equation (44) is satisfied and which has a construction by which MEL can be restricted.

Since there is no restrictive condition on geometrical phase difference between the sending and reflecting electrodes, it is possible to completely restrict MEL under the condition defined by the equation (45).

This embodiment can realize a complete unidirectionality with only one phase-shifter element as in the ninth embodiment.

By using this electrode pattern in a portion or a whole portion of a transducer of a surface acoustic wave device to reduce component of TTE which is caused by RW and to restrict group delay time deviation, it is possible to provide a surface acoustic wave device having a single phase-shifter element.

Also, in this case, there is no restrictive condition of geometric phase difference as shown by the equation (45)

and width of respective fingers of the sending and reflecting electrodes can be selected arbitrarily so long as the equation (45) is satisfied, admittances of the respective electrodes have different values and its construction can restrict MEL.

Figure 26:
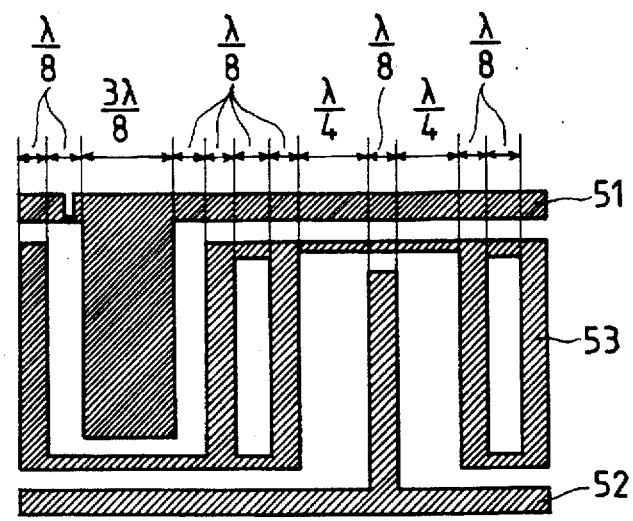
FIG. 26 shows an electrode pattern of a group type unidirectional transducer according to an eleventh embodiment of the present invention.

FIG. 26 shows an electrode pattern of a surface acoustic wave device according to an eleventh embodiment of the present invention.

Also, in this embodiment, the electrode pattern is constituted with a sending electrode 51, a reflecting electrode 52 and a meandering electrode 53. This pattern is similar to that shown in FIG. 25 except that one of the two openings is moved to the center portion of the meandering electrode 53.

This electrode pattern indicates a group of unidirectional electrodes which is designed such that the condition defined by the equation (45) which is derived from the equation (44) is satisfied and which has a construction by which MEL can be restricted, as in the eighth embodiment.

Further, as in the seventh embodiment, a complete unidirectionality can be realized with only one phase-shifter element. In the seventh and eighth embodiments, restriction of MEL is possible correspondingly to change of the width L of the center portion of the meandering electrode 53 in the tenth embodiment.

In either the eighth embodiment or the seventh embodiment, which requires only one phase-shifter element, there is no restrictive condition of geometrical phase difference which corresponds to L in the ninth embodiment and the restriction of MEL is possible.

Figure 27:
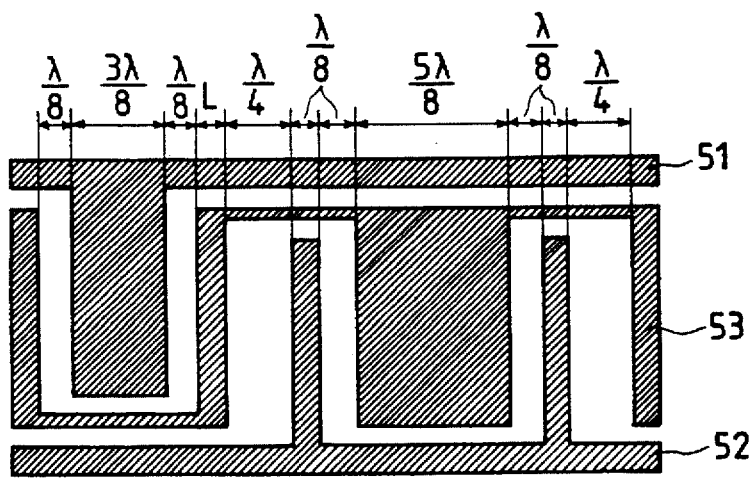
FIG. 27 shows an electrode pattern of a group type unidirectional transducer according to a twelfth embodiment of the present invention.

FIG. 27 shows an electrode construction of a surface acoustic wave device according to a twelfth embodiment of the present invention.

In the ninth embodiment, the electrode construction is also constituted with a sending electrode 51, a reflecting electrode 52 and a meandering electrode 53.

This electrode pattern indicates a group of unidirectional interdigital transducer which is designed such that the condition defined by the equation (45) which is derived from the equation (44) is satisfied and which can restrict component caused by RW among TTE and can reduce ripple within a signal pass band and restrict group delay time deviation, as in the ninth embodiment.

This electrode pattern is designed such that admittances of the sending and reflecting electrodes are different and absolute values thereof are equal. With this construction, it is possible to realize a complete unidirectionality without or with only one phase-shifter element.

By using this electrode pattern for a portion of or a whole portion of the transducer of the surface acoustic wave device, reduction of ripple within the signal pass-band due to TTE restriction and restriction of group delay time deviation are possible without or with only one phase-shifter element.

In this case, there is no restrictive condition of geometrical phase difference as shown by the equation (45) and finger width of the respective sending and reflecting electrodes can be selected arbitrarily so long as they satisfy the equation (45) and admittance of them are different while absolute values thereof are equal.

Figure 28:
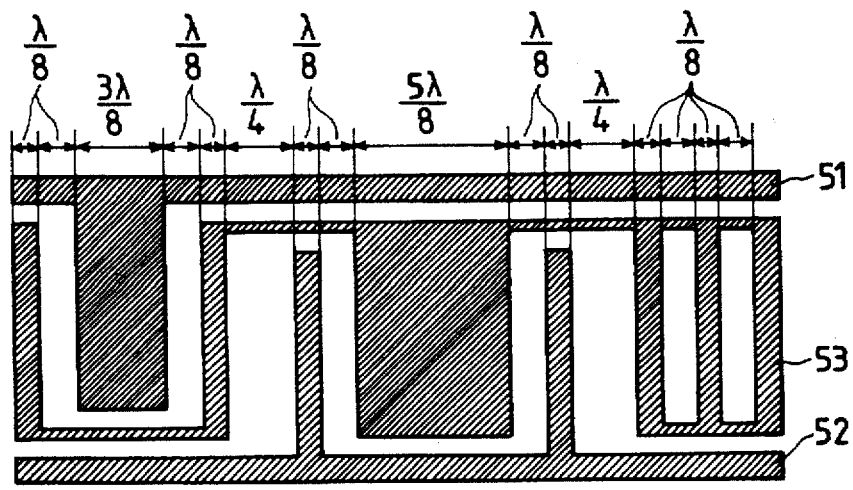
FIG. 28 shows an electrode pattern of a group type unidirectional transducer according to a thirteenth embodiment of the present invention.

FIG. 28 shows an electrode pattern of an acoustic surface wave device according to a thirteenth embodiment of the present invention.

The electrode pattern of this embodiment is also constituted with a sending electrode 51, a reflecting electrode 52 and a meandering electrode 53.

This electrode pattern also indicates a unidirectional interdigital transducer group and satisfies the condition defined by the equation (45) derived from the equation(44). With this pattern, MEL is further restricted.

Constructive condition indicated by the equation(45) does not include restrictive condition of geometrical phase difference between the sending and reflecting electrodes and therefore the pattern can completely restrict MEL.

As in the twelfth embodiment, the complete unidirectionality can be realized without using or with using only one phase-shifter element.

By using this electrode pattern for a portion of or a whole portion of the transducer of the surface acoustic wave device, reduction of ripple within the signal pass-band due to TTE restriction and restriction of group delay time deviation are possible without or with only one phase-shifter element.

In this case, there is no restrictive condition of geometrical phase difference as shown by the equation (45) and electrode finger width of the respective sending and reflecting electrodes can be any so long as they satisfy the equation (45) and admittance of them are different while absolute values thereof are equal.

Figure 29:
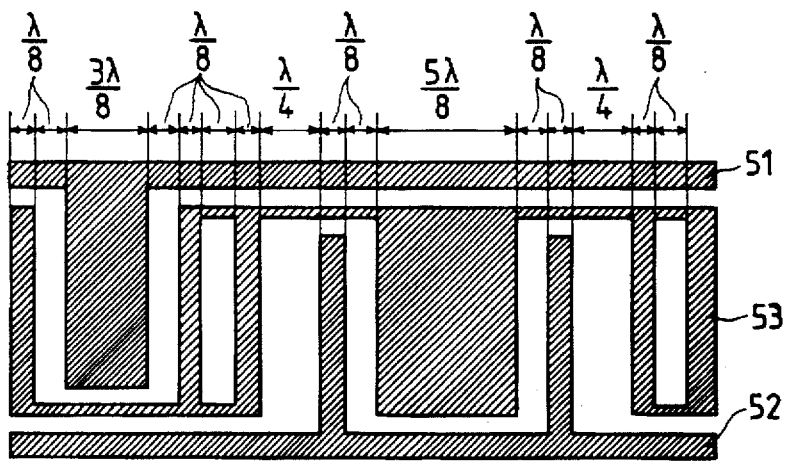
FIG. 29 shows an electrode pattern of a group type unidirectional transducer according to a fourteenth embodiment of the present invention.

FIG. 29 shows an electrode pattern of an acoustic surface wave device according to a fourteenth embodiment of the present invention.

The electrode pattern of this embodiment is also constituted with a sending electrode 51, a reflecting electrode 52 and a meandering electrode 53.

This electrode pattern also indicates a unidirectional transducer group and satisfies the condition defined by the equation (45) derived from the equation (44). With this pattern, MEL is further restricted. As in the twelfth embodiment, the complete unidirectionality can be realized without using or with using only one phase-shifter element.

The thirteenth and fourteenth embodiments have no restrictive condition of geometrical phase difference corresponding to L in the twelfth embodiment and are capable of restricting MEL without or with single phase-shifter, respectively.

Figure 30:
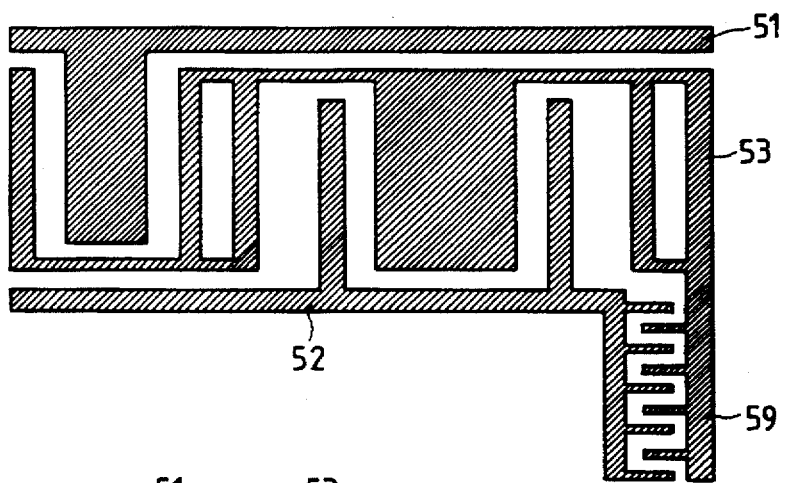
FIG. 30 shows an electrode pattern of a group type unidirectional transducer according to a fifteenth embodiment of the present invention, which includes a capacitive electrode pattern portion.

FIG. 30 shows an electrode pattern of a surface acoustic wave device according to a fifteenth embodiment of the present invention.

The electrode pattern of this embodiment is constituted with a sending electrode 51, a reflecting electrode 52, a meandering electrode 53 and a capacitive electrode pattern 59.

This electrode pattern also indicates a unidirectional interdigital transducer group and satisfies the condition defined by the equation (45) derived from the equation (44). With this pattern, TTE is restricted as in the seventh embodiment, reduction of ripple within the signal pass band due to TTE restriction and restriction of group delay time deviation are possible.

Since this electrode pattern is designed such that admittance of the sending and reflecting electrodes are different while absolute values thereof are equal, a complete unidirectionality can be realized without or with only one phase-shifter.

By providing the capacitive electrode pattern 59 shown in FIG. 30 on the piezoelectric substrate as a phase-shifter, the surface acoustic wave device does not require any external phase-shifter.

As mentioned, it is possible to construct a surface acoustic wave device which does not require any external phase-shifter, by arranging one of the capacitive electrode pattern and an inductive electrode pattern on the piezoelectric substrate as a phase-shifter.

By using this electrode pattern for a portion of or a whole portion of the transducer of the surface acoustic wave device, reduction of ripple within the signal pass band due to TTE restriction and restriction of group delay time deviation are possible without necessity of a further phase-shifter element.

In this case, there is no restrictive condition of geometrical phase difference as shown by the equation (45) and electrode finger width of the respective sending and reflecting electrodes can be any so long as they satisfy the equation (45) and admittance of them are different while absolute values thereof are equal.

As another embodiment of the present invention, an electrode construction is possible in which, in order to obtain a complete unidirectionality, various electrodes are arranged under the predetermined conditions and, in order to further restrict mass electrical loading, a meandering electrode is formed with a non-metalized portion or non-metalized portions.

Figure 31:
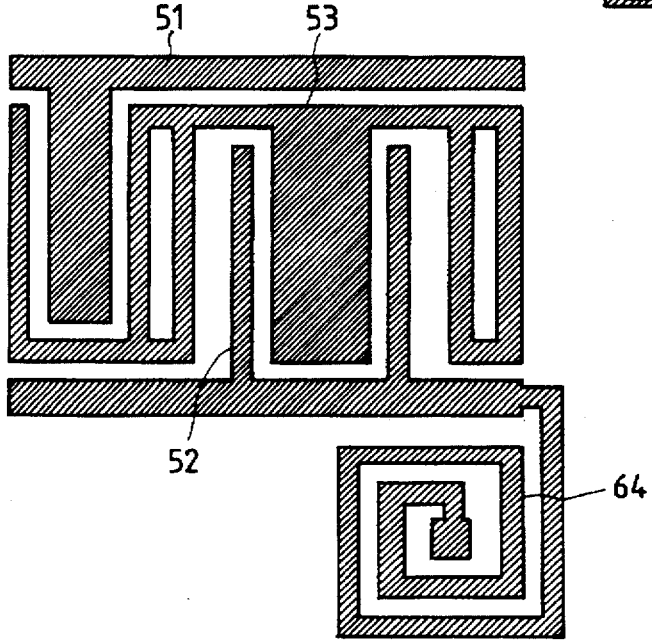
FIG. 31 shows an electrode pattern of a group type unidirectional transducer according to a sixteenth embodiment of the present invention, which includes an inductive electrode pattern portion.

FIG. 31 shows an electrode pattern of a surface acoustic wave device according to a sixteenth embodiment of the unidirectional group type acoustic surface wave device according to the present invention.

The embodiment shown in FIG. 31 includes a transmitting electrode 51, a reflection electrode 52, a meandering electrode 53 and an inductive electrode pattern 64 and satisfies the condition defined by the equation (45) derived from the equation (44). Therefore, it is possible to reduce ripple within a signal pass band and to suppress deviation of group delay time. This electrode pattern is designed such that admittances of the transmitting electrode and the reflecting electrode are different but their absolute values are equal, and thus, it can realize a complete unidirectionality with one phase-shifting element or without phase shifting element.

That is, by providing the inductive electrode pattern 64 shown in FIG. 31, a resultant surface acoustic wave device does not require any phase shifting element.

Figure 32:
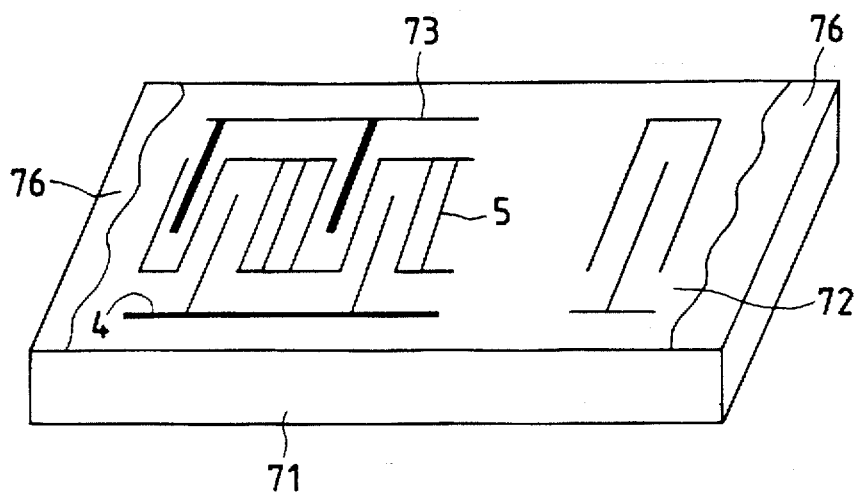
FIG. 32 is a perspective view of a surface acoustic wave device according to a seventeenth embodiment of the present invention, useful for explanation of operation thereof.

FIG. 32 shows a seventeenth embodiment of the acoustic surface wave device having a surface acoustic wave electrode pattern according to the present invention which is composed of an acoustic surface wave substrate 71 and thin film electrodes formed thereon.

In this embodiment, the thin film electrodes includes an output transducer 72, a sending electrode 73, a reflecting electrode 74 and a meandering electrode 75. In opposite end portions of the substrate 71, acoustic surface wave absorbers 76 are provided, respectively.

The meandering electrode 75 may be omitted depending upon application.

The embodiment shown in FIG. 32 serves as, for example, a filter for high frequency electric signal. In this embodiment, the thickness of electrode finger is 0.015λ, where λ is a center wavelength of acoustic surface wave.

It should be noted that the width and thickness of the electrode finger are not limited to values used in various embodiments to be described. As to the width of electrode finger, it is possible to control the directionality of propagating surface acoustic wave energy by increasing or reducing the above mentioned width of at least one electrode finger by a value smaller than λ/8, with the center position of the same finger being unchanged.

Figure 33:
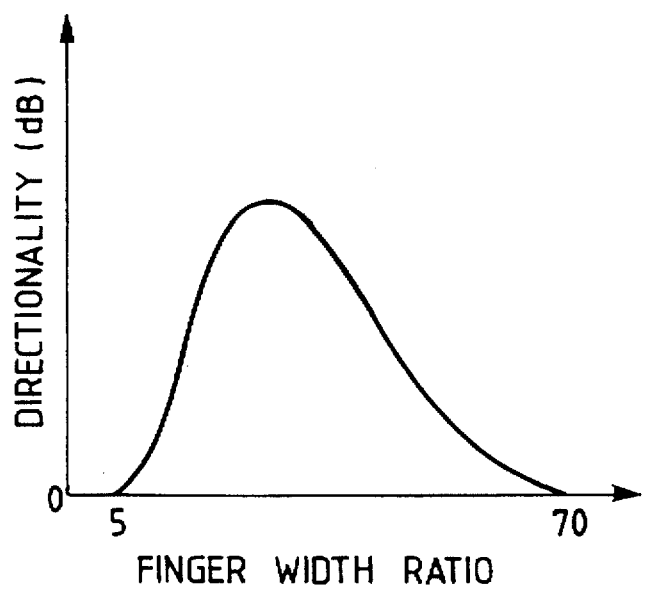
FIG. 33 is a graph showing a relation between directionality and finger width of the surface acoustic wave device shown in FIG. 32.
Figure 34:
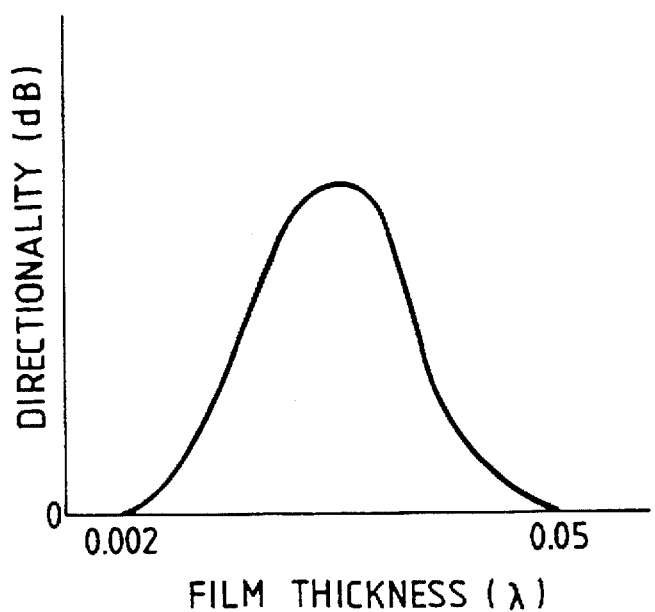
FIG. 34 is a graph showing a relation between directionality and finger thickness of the surface acoustic wave device shown in FIG. 32.

FIGS. 33 and 34 show relations of directionality which is a difference in insertion loss of acoustic surface wave energy between forward and backward directions to width and thickness of the electrode, respectively. Details of the eighteenth embodiment will be described with reference to FIG. 36.

From FIG. 33, it is generally clear that the directionality of acoustic surface wave energy propagation can be controlled by changing the width of at least one of the electrode fingers with their center positions being unchanged. Further, from FIG. 34, it is generally clear that it is possible to change the directionality by changing the thickness of at least one electrode finger within a range from 0.002λ to 0.05λ.

Figure 35:
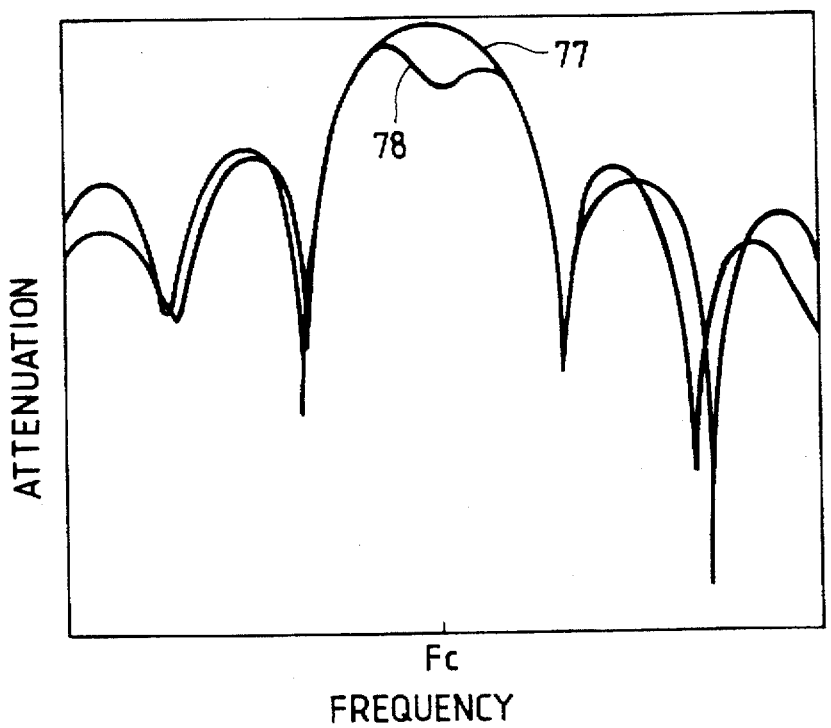
FIG. 35 shows an insertion loss—frequency characteristics of the surface acoustic wave device shown in FIG. 32.

FIG. 35 shows its frequency characteristics of insertion loss in forward and backward propagation direction of acoustic surface wave energy by curves 77 and 78, respectively. As is clear from FIG. 35, the lower the acoustic surface wave frequency is the larger the attenuation.

That is, assuming one span of electrode pattern and overlapping acoustic reflection of acoustic surface wave energy at respective electrode edges, there are differences in energy and phase of acoustic surface wave between forward and backward directions, by which the directionality of acoustic surface wave propagation is provided.

Now, electrode patterns with which directionality becomes as high as possible to reduce the number of phase-shifters will be described.

Figure 36:
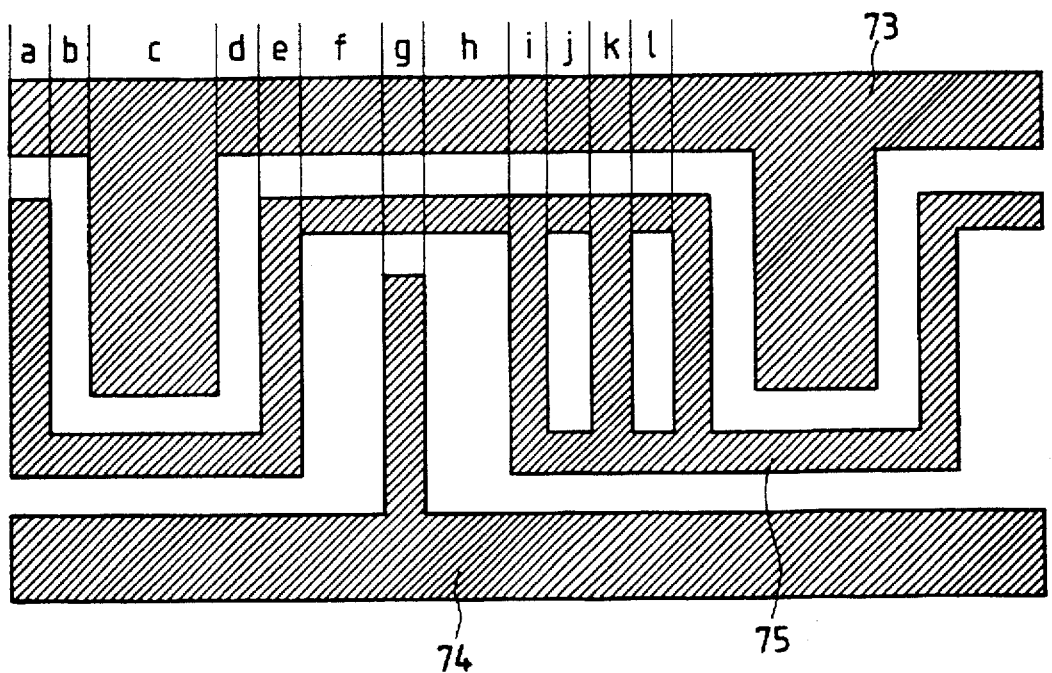
FIG. 36 shows an electrode pattern of a surface acoustic wave device according to a eighteenth embodiment of the present invention.

FIG. 36 shows an electrode pattern according to an eighteenth embodiment of the present invention which is one example by which high directionality is provided. In FIG. 36, the acoustic surface wave device includes a sending electrode 73, a reflecting electrode 74 and a meandering electrode 75.

In this embodiment, the thickness of electrode film is 0.015λ. For one span of this electrode pattern, the arranging order and width of the electrode fingers are as follow:

The meandering electrode finger a: λ/8, a space b: λ/8, the sending electrode finger c: 3λ/8, a space d: λ/8, the meandering electrode finger e: λ/8, a space f: λ/4, the reflecting electrode finger g: λ/8, a space h: λ/4, the meandering electrode finger i: λ/8, a space j: λ/8, the meandering electrode finger k: λ/8 and a space l: λ/8.

The directionality of this electrode pattern can be controlled by changing the described width of at least one electrode finger by a value smaller than λ/8, with center positions of these electrode fingers and the arranging order of these electrode fingers and the spaces being unchanged. Further, the directionality thereof can be controlled by setting the thickness of electrode fingers within a range from 0.002λ to 0.05λ. This is true for all of the embodiments of the present invention.

Figure 37:
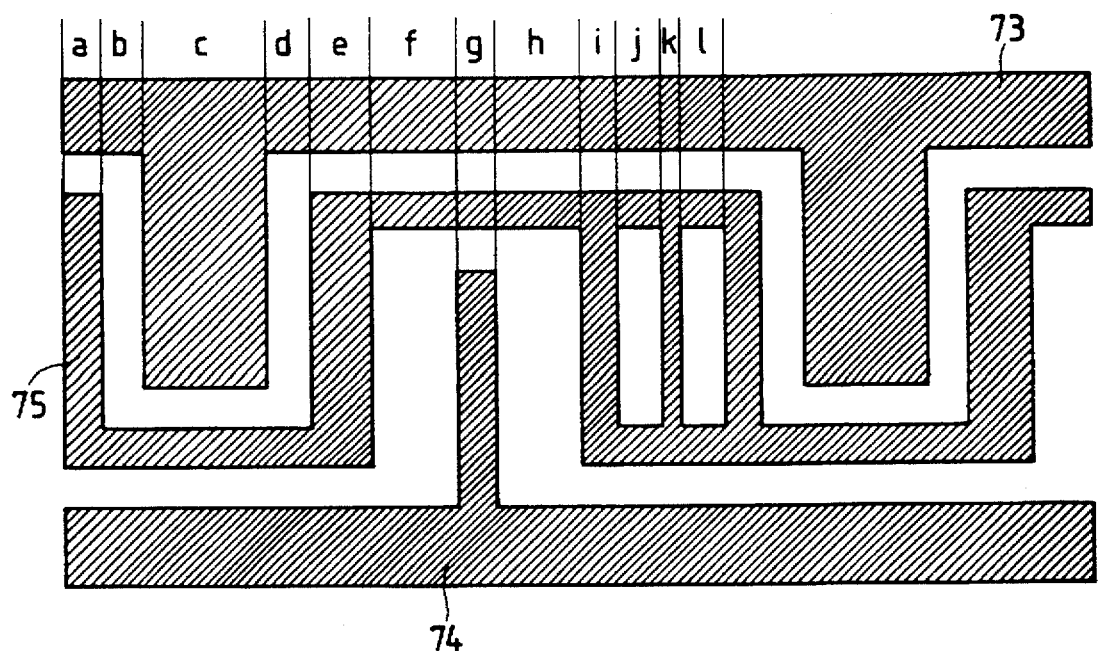
FIG. 37 shows an electrode pattern of a surface acoustic wave device according to an nineteenth embodiment of the present invention.

FIG. 37 shows an electrode pattern according to a nineteenth embodiment of the present invention. In FIG. 37, the acoustic surface wave device includes a sending electrode 73, a reflecting electrode 74 and a meandering electrode 75.

In this embodiment, the thickness of electrode film is 0.015λ. For one span of this electrode pattern, the arranging order and width of the electrode fingers are as follow:

The meandering electrode finger a: λ/8, a space b: λ/8, the sending electrode finger c: 3λ/8, a space d: λ/8, the meandering electrode finger e: 3λ/16, a space f: λ/4, the reflecting electrode finger g: λ/8, a space h: λ/4, the meandering electrode finger i: λ/8, a space j: λ/8, the meandering electrode finger k: λ/16 and a space l: λ/8.

The directionality of this electrode pattern can be controlled by changing the width of a portion or the whole of electrode fingers within a value smaller than λ/8, with center positions of these electrode fingers and the arranging order of these electrode fingers and the spaces being unchanged. Further, the directionality thereof can be controlled by setting the thickness of electrode fingers to a value within a range from 0.002λ to 0.05λ.

Figure 38:
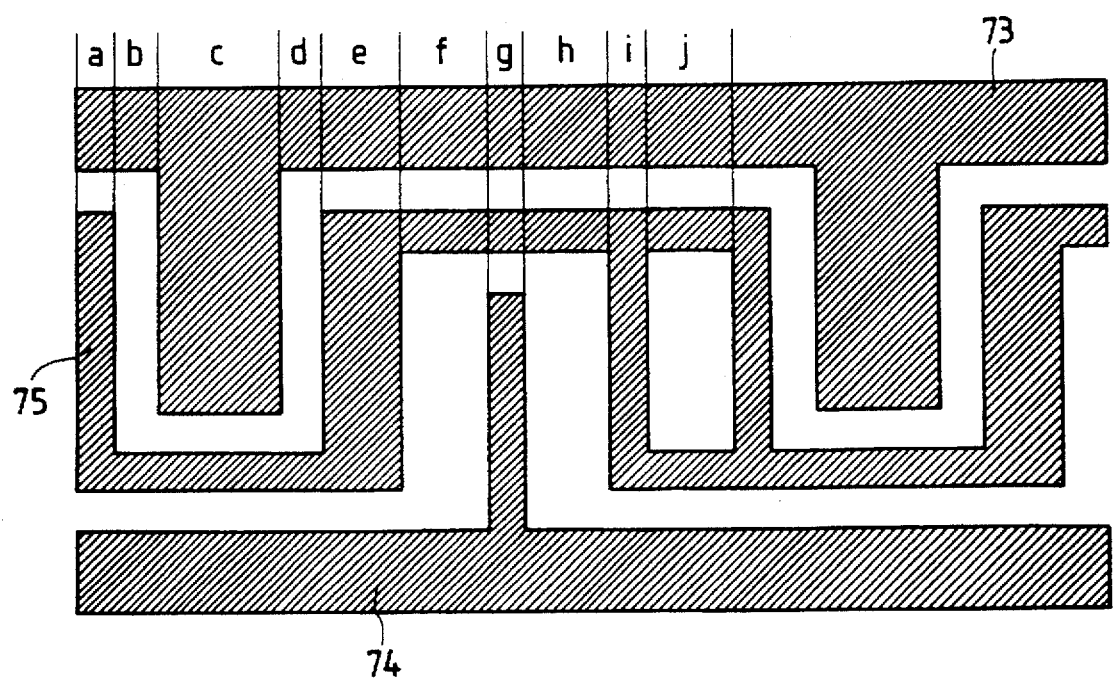
FIG. 38 shows an electrode pattern of a surface acoustic wave device according to a twentieth embodiment of the present invention.

FIG. 38 shows an electrode pattern according to a twentieth embodiment of the present invention. In FIG. 38, the acoustic surface wave device includes a sending electrode 73, a reflecting electrode 74 and a meandering electrode 75.

In this embodiment, the thickness of electrode film is 0.015$\lambda$. For one span of this electrode pattern, the arranging order and width of the electrode fingers are as follow:

The meandering electrode finger a: $\lambda/8$, a space b: $\lambda/8$, the sending electrode finger c: 3 $\lambda/8$, a space d: $\lambda/8$, the meandering electrode finger e: 3 $\lambda/8$, a space f: $\lambda/8$, the meandering electrode finger g: $\lambda/4$, a space h: $\lambda/4$, the reflecting electrode finger i: $\lambda/8$, a space j: $\lambda/4$, the meandering electrode finger k: $\lambda/8$ and a space l: $\lambda/4$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from 0.002$\lambda$ to 0.05$\lambda$.

Figure 39:
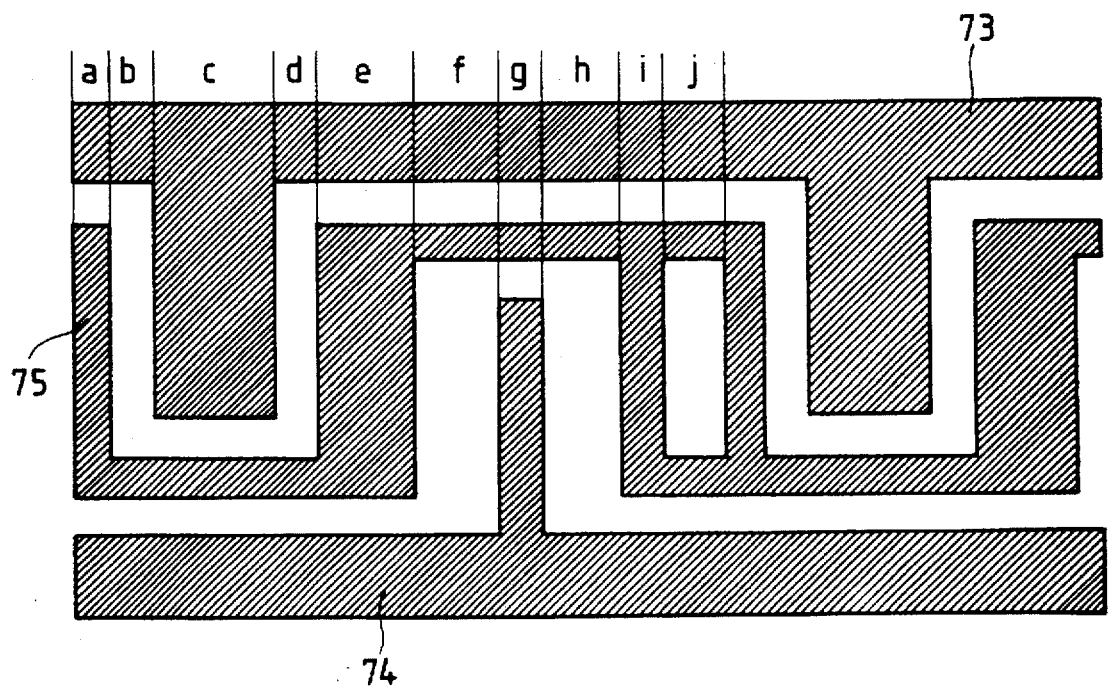
FIG. 39 shows an electrode pattern of a surface acoustic wave device according to a twenty-first embodiment of the present invention.

FIG. 39 shows an electrode pattern according to a twenty-first embodiment of the present invention. In FIG. 39, the acoustic surface wave device includes a sending electrode 73, a reflecting electrode 74 and a meander electrode 75.

In this embodiment, the thickness of electrode film is 0.015$\lambda$. For one span of this electrode pattern, the arranging order and width of the electrode fingers are as follow:

The meandering electrode finger a: $\lambda/8$, a space b: $\lambda/8$, the sending electrode finger c: 3$\lambda/8$, a space d: $\lambda/8$, the meandering electrode finger e: 5$\lambda/16$, a space f: $\lambda/4$, the reflecting electrode finger g: $\lambda/8$, a space h: $\lambda/4$, the meandering electrode finger i: $\lambda/8$ and a space j: 3$\lambda/16$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from 0.002$\lambda$ to 0.05$\lambda$.

Figure 40:
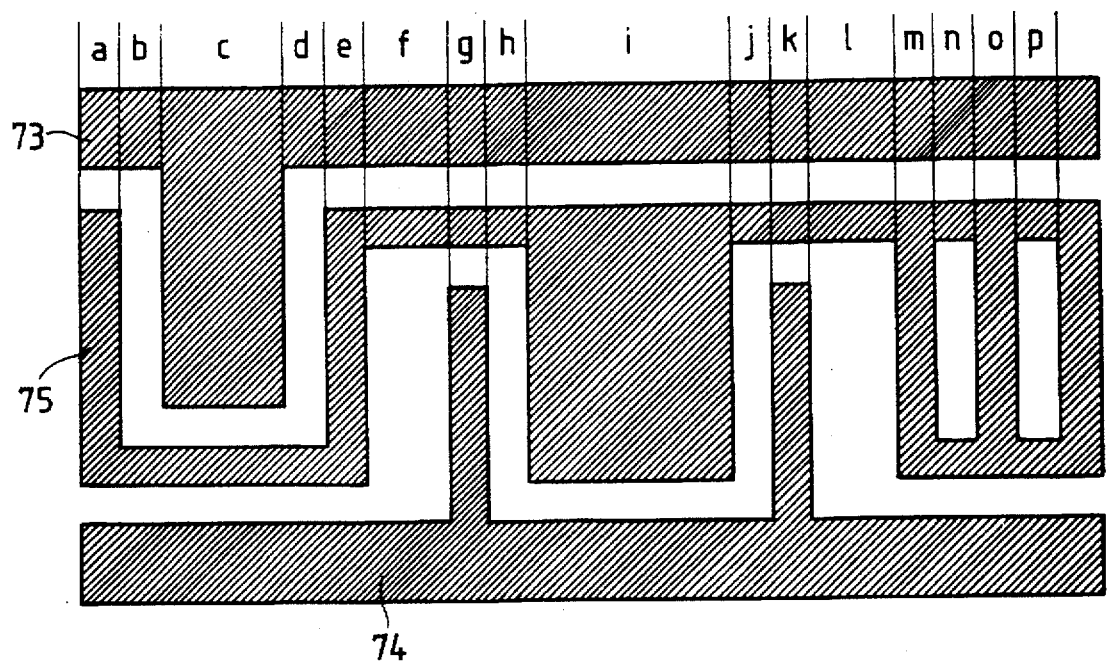
FIG. 40 shows an electrode pattern of a surface acoustic wave device according to a twenty-second embodiment of the present invention.

FIG. 40 shows an electrode pattern according to a twenty-second embodiment of the present invention. In FIG. 40, the surface acoustic wave device includes a sending electrode 73, a reflecting electrode 74 and a meander electrode 75.

In this embodiment, the thickness of electrode film is 0.015$\lambda$. For one span of this electrode pattern, the arranging order and width of the electrode fingers are as follow:

The meandering electrode finger a: $\lambda/8$, a space b: $\lambda/8$, the sending electrode finger c: 3$\lambda/8$, a space d: $\lambda/8$, the meandering electrode finger e: $\lambda/8$, a space f: $\lambda/4$, the reflecting electrode finger g: $\lambda/8$, a space h: $\lambda/8$, the meandering electrode finger i: 5$\lambda/8$, a space j: $\lambda/8$, the reflecting electrode finger k: $\lambda/8$, a space l: $\lambda/4$, the meandering electrode finger m: $\lambda/8$, a space n: $\lambda/8$, the meandering electrode finger o: $\lambda/8$ and a space p: $\lambda/8$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from 0.002$\lambda$ to 0.05$\lambda$.

Figure 41:
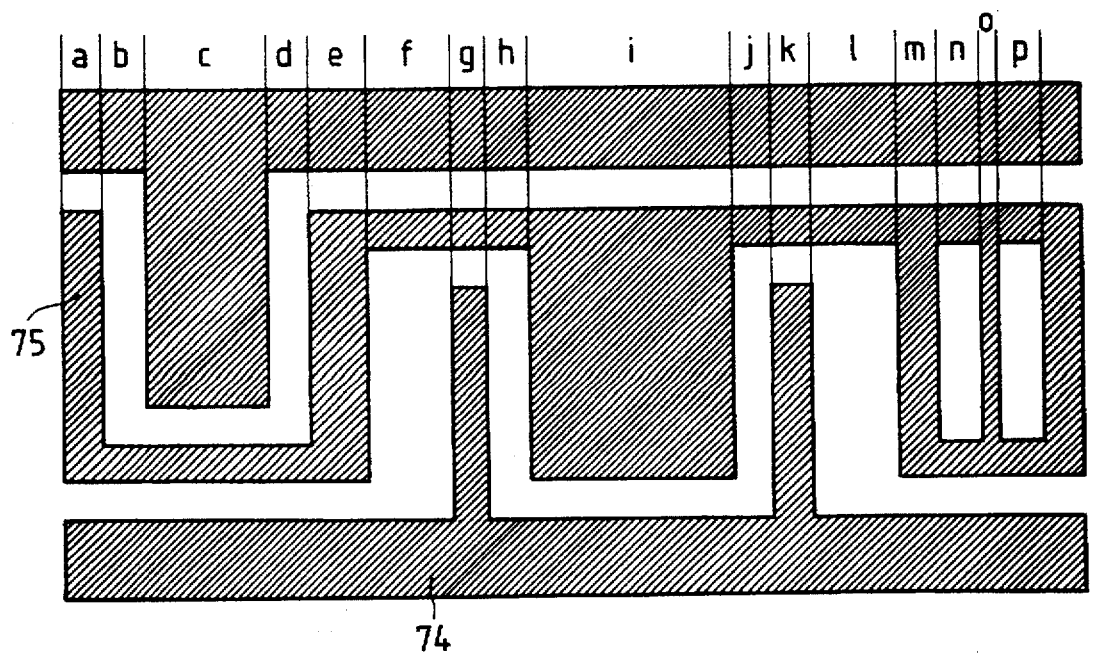
FIG. 41 shows an electrode pattern of a surface acoustic wave device according to a twenty-third embodiment of the present invention.

FIG. 41 shows an electrode pattern according to a twenty-third embodiment of the present invention. In FIG. 41, the acoustic surface wave device includes a sending electrode 73, a reflecting electrode 74 and a meander electrode 75.

In this embodiment, the thickness of electrode film is 0.015$\lambda$. For one span of this electrode pattern, the arranging order and width of the electrode fingers are as follow:

The meandering electrode finger a: $\lambda/8$, a space b: $\lambda/8$, the sending electrode finger c: 3$\lambda/8$, a space d: $\lambda/8$, the meandering electrode finger e: 3$\lambda/16$, a space f: $\lambda/4$, the reflecting electrode finger g: $\lambda/8$, a space h: $\lambda/8$, the meandering electrode finger i: 5$\lambda/8$, a space j: $\lambda/8$, the reflecting electrode finger k: $\lambda/8$, a space l: $\lambda/4$, the meandering electrode finger m: $\lambda/8$, a space n: $\lambda/8$, the meandering electrode finger o: $\lambda/16$ and a space p: $\lambda/8$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from 0.002$\lambda$ to 0.05$\lambda$.

Figure 42:
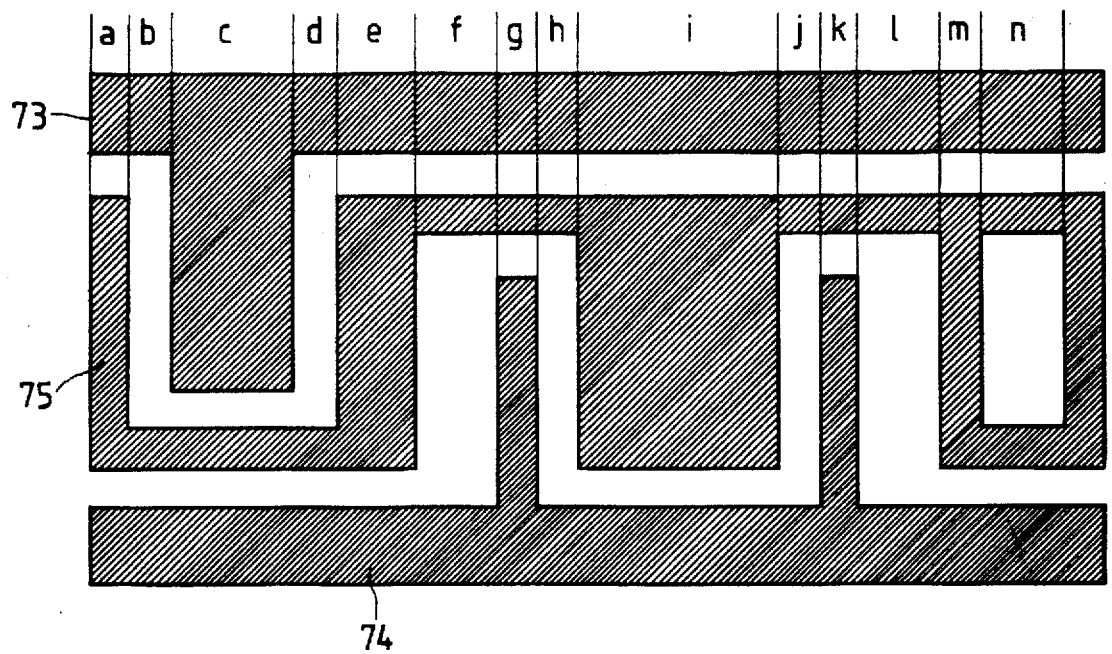
FIG. 42 shows an electrode pattern of a surface acoustic wave device according to a twenty-fourth embodiment of the present invention.

FIG. 42 shows an electrode pattern according to a twenty-fourth embodiment of the present invention. In FIG. 42, the acoustic surface wave device includes a sending electrode 73, a reflecting electrode 74 and a meander electrode 75.

In this embodiment, the thickness of electrode film is 0.015$\lambda$. For one span of this electrode pattern, the arranging order and width of the fingers are as follow:

The meandering electrode finger a: $\lambda/8$, a space b: $\lambda/8$, the transmitting electrode finger c: 3$\lambda/8$, a space d: $\lambda/8$, the meandering electrode finger e: $\lambda/4$, a space f: $\lambda/4$, the reflecting electrode finger g: $\lambda/8$, a space h: $\lambda/8$, the meandering electrode finger i: 5$\lambda/8$, a space j: $\lambda/8$, the reflecting electrode finger k: $\lambda/8$, a space l: $\lambda/4$, the meandering electrode finger m: $\lambda/8$ and a space n: $\lambda/4$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from 0.002$\lambda$ to 0.05$\lambda$.

Figure 43:
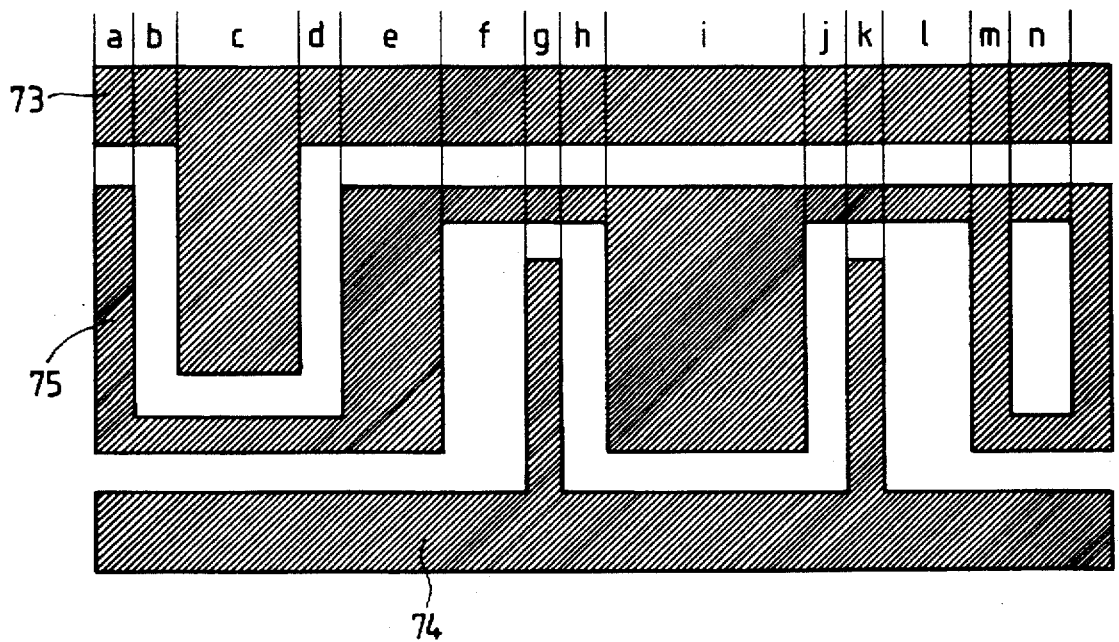
FIG. 43 shows an electrode pattern of a surface acoustic wave device according to a twenty-fifth embodiment of the present invention.

FIG. 43 shows an electrode pattern according to twenty-fifth embodiment of the present invention. In FIG. 43, the acoustic surface wave device includes a sending electrode 73, a reflecting electrode 74 and a meander electrode 75.

In this embodiment, the thickness of electrode film is 0.015$\lambda$. For one span of this electrode pattern, the arranging order and width of the electrode fingers are as follow:

The meandering electrode finger a: $\lambda/8$, a space b: $\lambda/8$, the sending electrode finger c: 3$\lambda/8$, a space d: $\lambda/8$, the meandering electrode finger e: 5$\lambda/16$, a space f: $\lambda/4$, the reflecting electrode finger g: $\lambda/8$, a space h: $\lambda/8$, the meandering electrode finger h: 5$\lambda/8$, a space i: $\lambda/8$, the reflecting electrode finger j: $\lambda/8$, a space k: $\lambda/4$, the meandering electrode finger l: $\lambda/8$ and a space m: 3$\lambda/16$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from 0.002$\lambda$ to 0.05$\lambda$.

Figure 44:
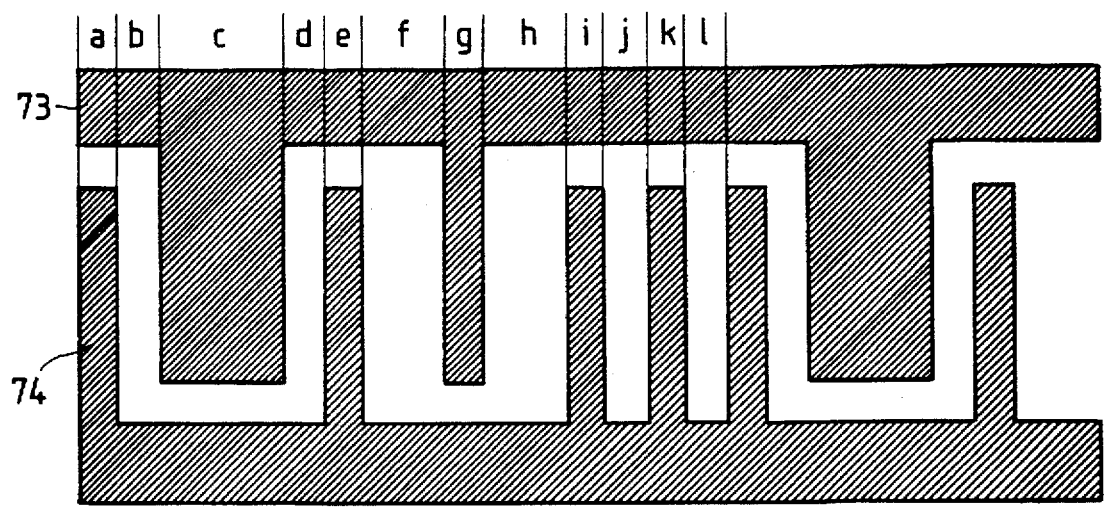
FIG. 44 shows an electrode pattern of a surface acoustic wave device according to a twenty-sixth embodiment of the present invention.

FIG. 44 shows an electrode pattern according to twenty-sixth embodiment of the present invention. In FIG. 44, the acoustic surface wave device includes a sending electrode 73 and a reflecting electrode 74. There is no meander electrode provided.

In this embodiment, the thickness of electrode film is 0.015$\lambda$. For one span of this electrode pattern, the arranging order and width of the electrode fingers are as follow:

The reflecting electrode finger a: $\lambda/8$, a space b: $\lambda/8$, the sending electrode finger c: $3\lambda/8$, a space d: the reflecting electrode finger e: $\lambda/8$, a space f: $\lambda/4$, the sending electrode finger g: $\lambda/8$, a space h: $\lambda/4$, the reflecting electrode finger i: $\lambda/8$, a space j: $\lambda/8$, the reflecting electrode finger k: $\lambda/8$ and a space l: $\lambda/8$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from $0.002\lambda$ to $0.05\lambda$.

Figure 45:
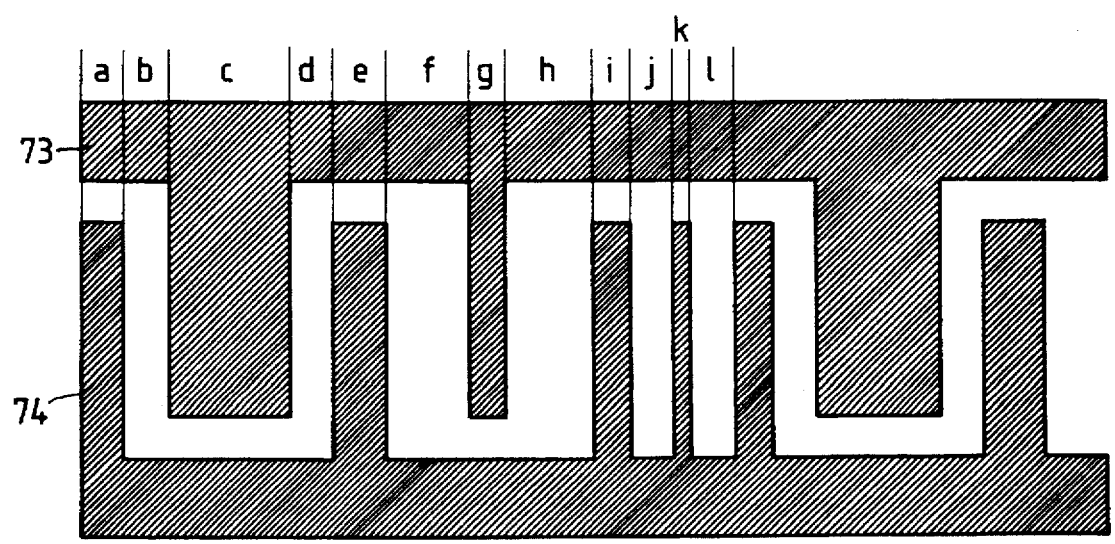
FIG. 45 shows an electrode pattern of a surface acoustic wave device according to a twenty-seventh embodiment of the present invention.

FIG. 45 shows an electrode pattern according to twenty-seventh embodiment of the present invention. In FIG. 45, the acoustic surface wave device includes a sending electrode 73 and a reflecting electrode 74. There is no meander electrode provided.

In this embodiment, the thickness of electrode film is $0.015\lambda$. For one span of this electrode pattern, the arranging order and width of the electrode fingers are as follow:

The reflecting electrode finger a: $\lambda/8$, a space b: $\lambda/8$, the sending electrode finger c: $3\lambda/8$, a space d: $\lambda/8$, the reflecting electrode finger e: $3\lambda/16$, a space f: $\lambda/4$, the sending electrode finger g: $\lambda/8$, a space h: $\lambda/4$, the reflecting electrode finger i: $\lambda/8$, a space j: $\lambda/8$, the reflecting electrode finger k: $\lambda/16$ and a space l: $\lambda/8$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from $0.002\lambda$ to $0.05\lambda$.

Figure 46:
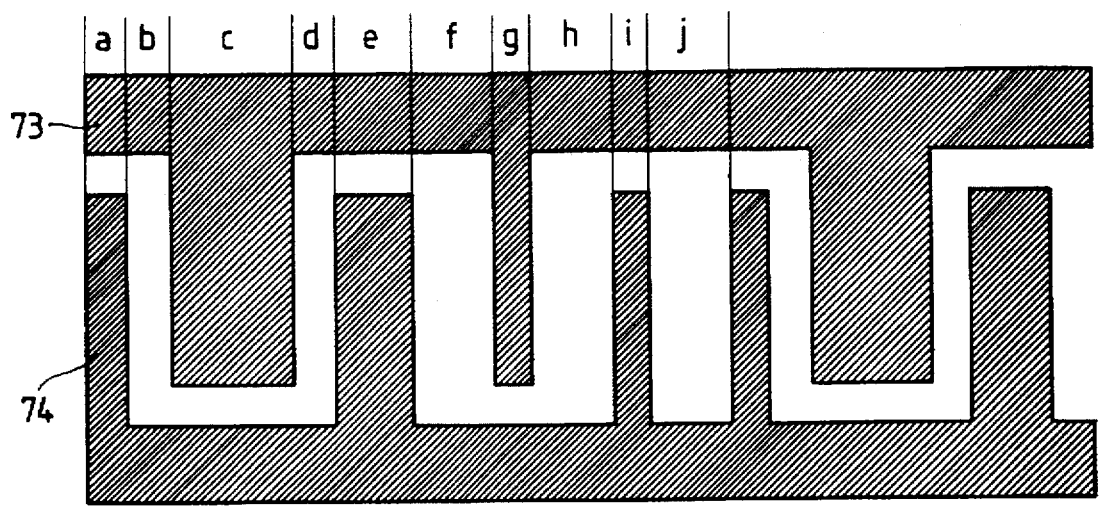
FIG. 46 shows an electrode pattern of a surface acoustic wave device according to a twenty-eighth embodiment of the present invention.

FIG. 46 shows an electrode pattern according to twenty-eighth embodiment of the present invention. In FIG. 46, the acoustic surface wave device includes a sending electrode 73 and a reflecting electrode 74. There is no meander electrode provided.

In this embodiment, the thickness of electrode film is $0.015\lambda$. For one span of this electrode pattern, the arranging order and width of the electrode fingers are as follow:

The reflecting electrode finger a: $\lambda/8$, a space b: $\lambda/8$, the sending electrode finger c: $3\lambda/8$, a space d: $\lambda/8$, the reflecting electrode finger e: $\lambda/4$, a space f: $\lambda/4$, the sending electrode finger g: $\lambda/8$, a space h: $\lambda/4$, the reflecting electrode finger i: $\lambda/8$ and a space j: $\lambda/4$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from $0.002\lambda$ to $0.05\lambda$.

Figure 47:
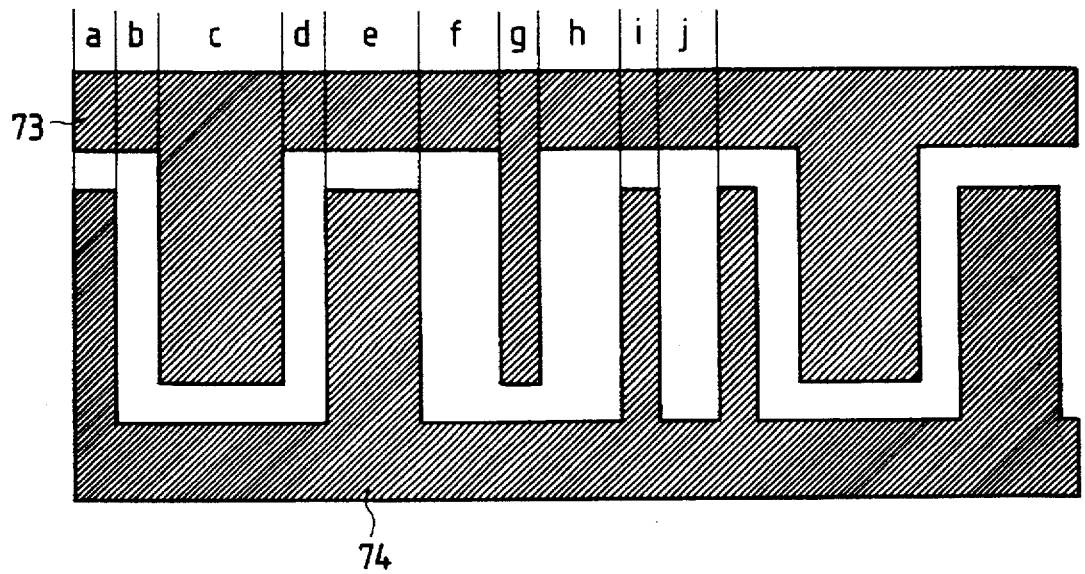
FIG. 47 shows an electrode pattern of a surface acoustic wave device according to a twenty-ninth embodiment of the present invention.

FIG. 47 shows an electrode pattern according to twenty-ninth embodiment of the present invention. In FIG. 47, the acoustic surface wave device includes a sending electrode 73 and a reflecting electrode 74. There is no meander electrode provided.

In this embodiment, the thickness of electrode film is $0.015\lambda$. For one span of this electrode pattern, the arranging order and width of the electrode fingers are as follow:

The reflecting electrode finger a: $\lambda/8$, a space b: $\lambda/8$, the sending electrode finger c: $3\lambda/8$, a space d: $\lambda/8$, the reflecting electrode finger e: $5\lambda/16$, a space g: $\lambda/4$, the sending electrode finger h: $\lambda/8$, a space i: $\lambda/4$, the reflecting electrode finger j: $\lambda/8$ and a space k: $3\lambda/16$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from $0.002\lambda$ to $0.05\lambda$.

Figure 48:
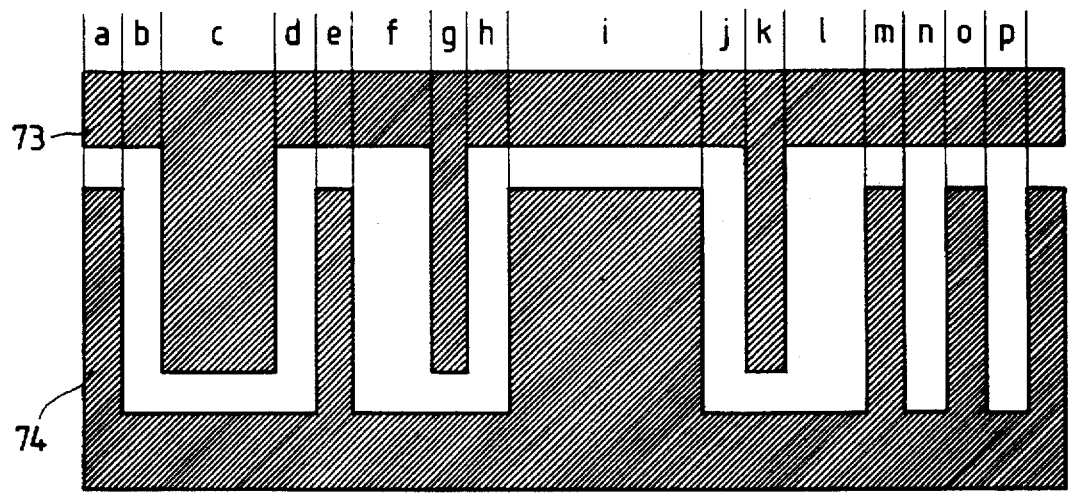
FIG. 48 shows an electrode pattern of a surface acoustic wave device according to a thirtieth embodiment of the present invention.

FIG. 48 shows an electrode pattern according to a thirtieth embodiment of the present invention. In FIG. 48, the acoustic surface wave device includes a sending electrode 73 and a reflecting electrode 74. There is no meander electrode provided.

In this embodiment, the thickness of electrode film is $0.015\lambda$. For one span of this electrode pattern, the arranging order and width of the electrode fingers are as follow:

The reflecting electrode finger a: $\lambda/8$, a space b: $\lambda/8$, the sending electrode finger c: $3\lambda/8$, a space d: $\lambda/8$, the reflecting electrode finger e: $\lambda/8$, a space f: $\lambda/4$, the sending electrode finger g: $\lambda/8$, a space h: $\lambda/8$, the reflecting electrode finger i: $5\lambda/8$, a space j: $\lambda/8$, the sending electrode finger k: $\lambda/8$, a space l: $\lambda/4$, the reflecting electrode finger m: $\lambda/8$, a space n: $\lambda/8$, the reflecting electrode finger o: $\lambda/8$ and a space p: $\lambda/8$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from $0.002\lambda$ to $0.05\lambda$.

Figure 49:
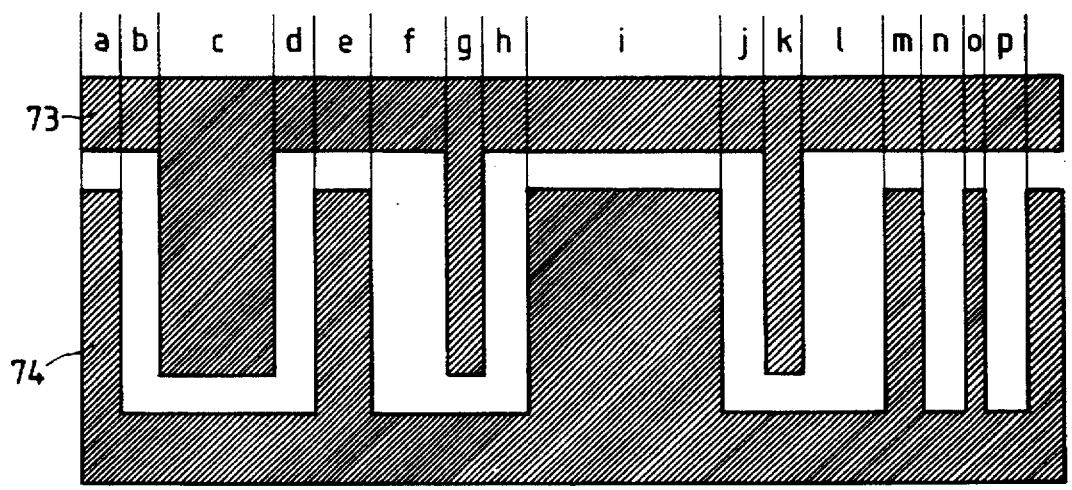
FIG. 49 shows an electrode pattern of a surface acoustic wave device according to a thirty-first embodiment of the present invention.

FIG. 49 shows an electrode pattern according to a twenty-first embodiment of the present invention. In FIG. 49, the acoustic surface wave device includes a sending electrode 73 and a reflecting electrode 74. There is no meander electrode provided.

In this embodiment, the thickness of electrode film is $0.015\lambda$. For one span of this electrode pattern, the arranging order and width of the electrode fingers are as follow:

The reflecting electrode finger a: $\lambda/8$, a space b: $\lambda/8$, the sending electrode finger c: $3\lambda/8$, a space d: $\lambda/8$, the reflecting electrode finger e: $3\lambda/16$, a space f: $\lambda/4$, the sending electrode finger g: $\lambda/8$, a space h: $\lambda/8$, the reflecting electrode finger i: $5\lambda/8$, a space j: $\lambda/8$, the sending electrode finger k: $\lambda/8$, a space l: $\lambda/4$, the reflecting electrode finger m: $\lambda/8$, a space n: $\lambda/8$, the reflecting electrode finger o: $\lambda/16$ and a space p: $\lambda/8$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from $0.002\lambda$ to $0.05\lambda$.

Figure 50:
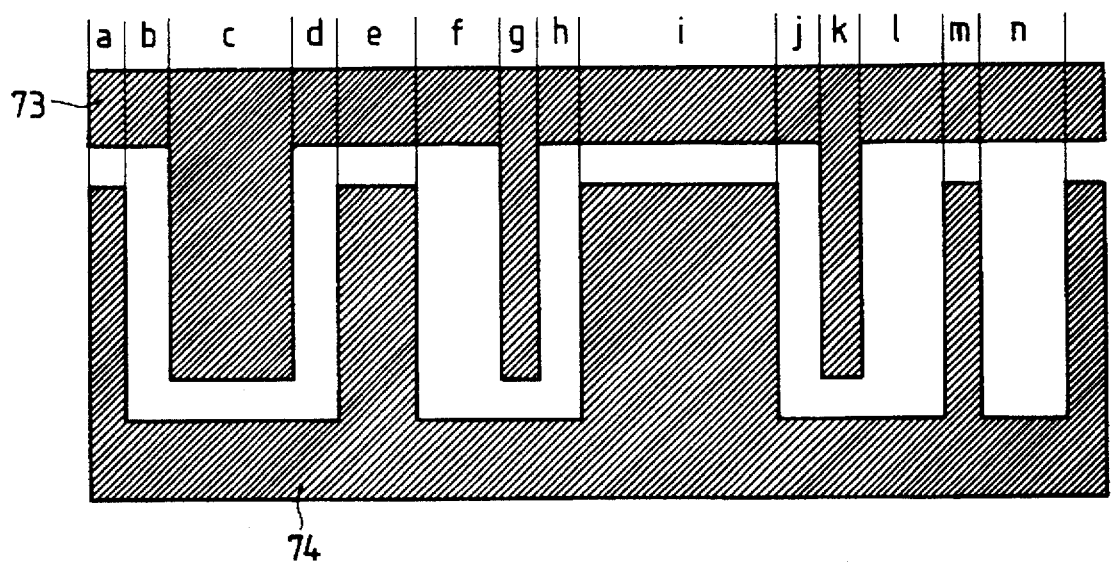
FIG. 50 shows an electrode pattern of a surface acoustic wave device according to a thirty-second embodiment of the present invention.

FIG. 50 shows an electrode pattern according to a thirty-second embodiment of the present invention. In FIG. 50, the acoustic surface wave device includes a sending electrode 73 and a reflecting electrode 74. There is no meander electrode provided.

In this embodiment, the thickness of electrode film is $0.015\lambda$. For one span of this electrode pattern, the arranging order and width of the electrode fingers are as follow:

The reflecting electrode finger a: $\lambda/8$, a space b: $\lambda/8$, the sending electrode finger c: $3\lambda/8$, a space d: $\lambda/8$, the reflecting electrode finger e: $\lambda/4$, a space f: $\lambda/4$, the sending electrode finger g: $\lambda/8$, a space h: $\lambda/8$, the reflecting electrode finger i: $5\lambda/8$, a space j: $\lambda/8$, the sending electrode finger k: $\lambda/8$, a space l: $\lambda/4$, the reflecting electrode finger m: $\lambda/8$ and a space n: $\lambda/4$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from $0.002\lambda$ to $0.05\lambda$.

Figure 51:
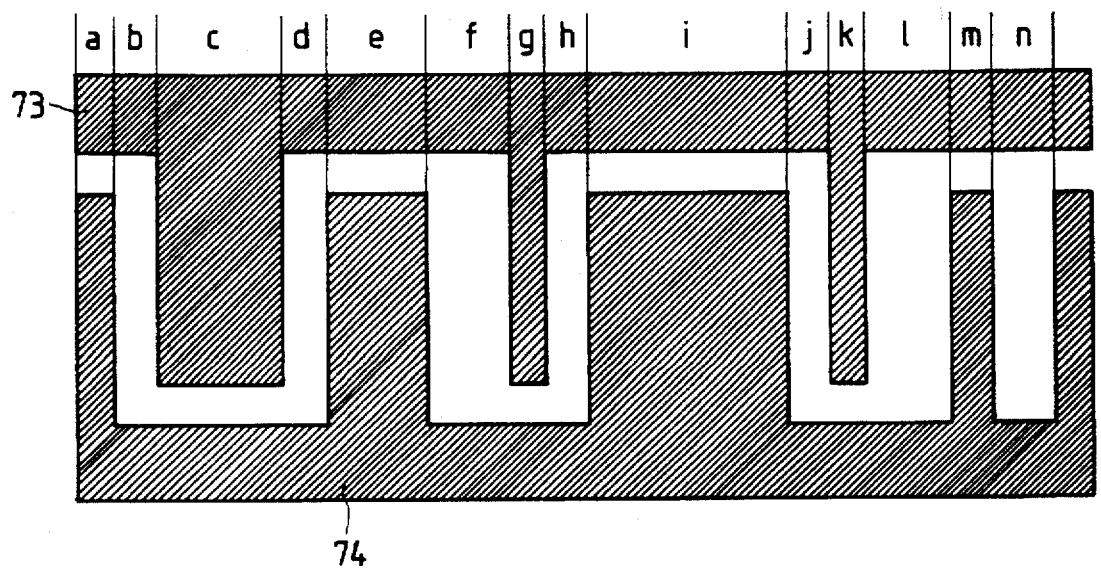
FIG. 51 shows an electrode pattern of a surface acoustic wave device according to a thirty-third embodiment of the present invention.

FIG. 51 shows an electrode pattern according to a thirty-third embodiment of the present invention. In FIG. 51, the acoustic surface wave device includes a sending electrode 73 and a reflecting electrode 74. There is no meander electrode provided.

In this embodiment, the thickness of electrode film is $0.015\lambda$. For one span of this electrode pattern, the arranging order and width of the electrode fingers are as follow:

The reflecting electrode finger a: $\lambda/8$, a space b: $\lambda/8$, the sending electrode finger c: $3\lambda/8$, a space d: $\lambda/8$, the reflecting electrode finger e: $5\lambda/16$, a space f: $\lambda/4$, the sending electrode finger g: $\lambda/8$, a space h: $\lambda/8$, the reflecting electrode finger i: $5\lambda/8$, a space j: $\lambda/8$, the sending electrode finger k: $\lambda/8$, a space l: $\lambda/4$, the reflecting electrode finger m: $\lambda/8$ and a space n: $3\lambda/16$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from $0.002\lambda$ to $0.05\lambda$.

Figure 52:
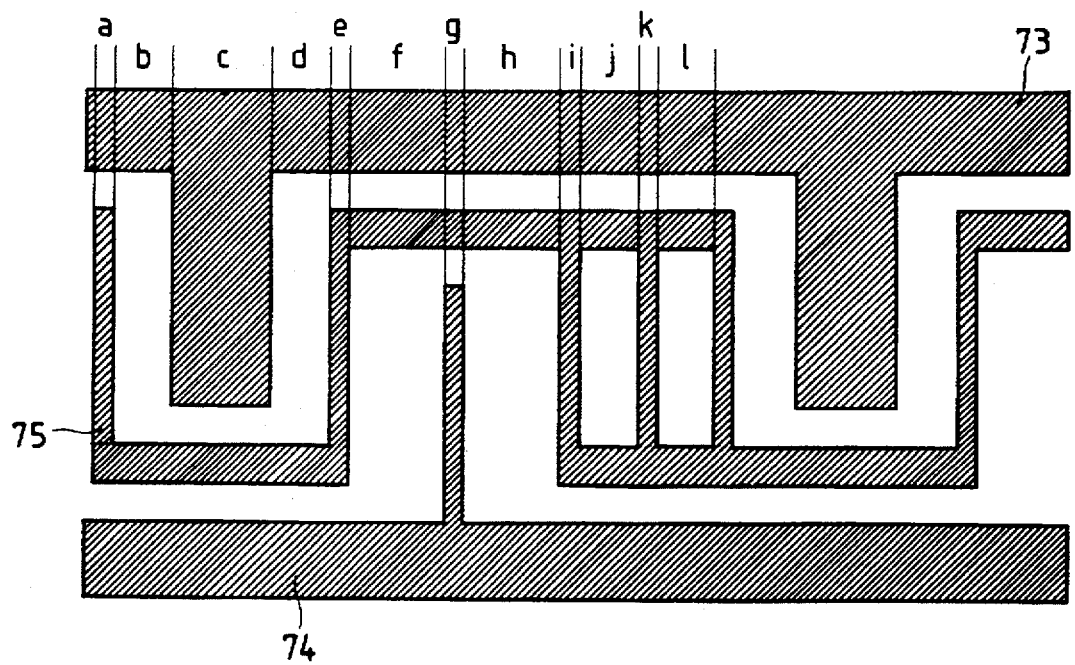
FIG. 52 shows an electrode pattern of a surface acoustic wave device according to a thirty-fourth embodiment of the present invention.

FIG. 52 shows an electrode pattern according to a thirty-fourth embodiment of the present invention. In FIG. 52, the acoustic surface wave device includes a sending electrode 73, a reflecting electrode 74 and a meander electrode 75.

In this embodiment, the thickness of electrode film is $0.015\lambda$. For one span of this electrode pattern, the arranging order and width of the electrode fingers are as follow:

The meandering electrode finger a: $\lambda/16$, a space b: $3\lambda/16$, the sending electrode finger c: $5\lambda/16$, a space d: $3\lambda/16$, the meandering electrode finger e: $\lambda/16$, a space f: $5\lambda/16$, the reflecting electrode finger g: $\lambda/16$, a space h: $5\lambda/16$, the meandering electrode finger i: $\lambda/16$, a space j: $3\lambda/16$, the meandering electrode finger k: $\lambda/16$, a space l: $3\lambda/16$, the meander electrode finger m: $\lambda/16$ and a space n: $3\lambda/16$.

The directionality of this electrode pattern can be controlled by changing the width of a portion or the whole of electrode fingers within a value smaller than $\lambda/8$, with center positions of these electrode fingers and the arranging order of these electrode fingers and the Spaces being unchanged. Further, the directionality thereof can be controlled by setting the thickness of electrode fingers within a range from $0.002\lambda$ to $0.05\lambda$.

Figure 53:
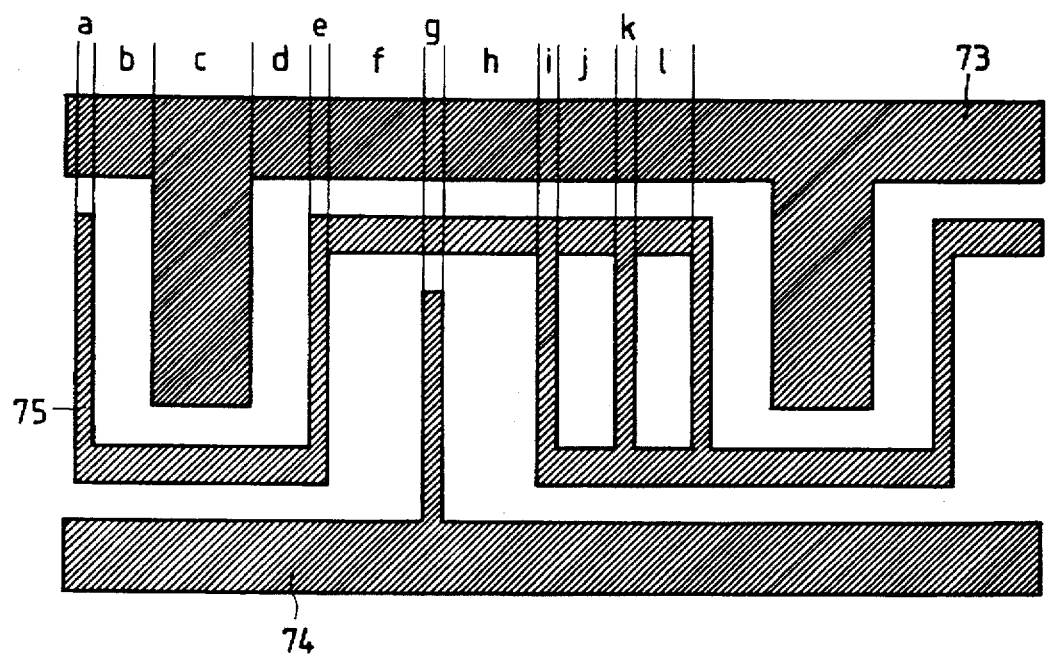
FIG. 53 shows an electrode pattern of a surface acoustic wave device according to a thirty-fifth embodiment of the present invention.

FIG. 53 shows an electrode pattern according to a thirty-fifth embodiment of the present invention. In FIG. 53, the acoustic surface wave device includes a sending electrode 73, a reflecting electrode 74 and a meander electrode 75.

In this embodiment, the thickness of electrode film is $0.015\lambda$. For one span of this electrode pattern, the arranging order and width of the electrode fingers are as follow:

The meandering electrode finger a: $\lambda/16$, a space b: $7\lambda/32$, the sending electrode finger c: $4\lambda/16$, a space d: $7\lambda/32$, the meandering electrode finger e: $\lambda/16$, a space f: $5\lambda/16$, the reflecting electrode finger g: $\lambda/16$, a space h: $5\lambda/16$, the meandering electrode finger i: $\lambda/16$, a space j: $3\lambda/16$, the meandering electrode finger k: $\lambda/16$ and a space l: $3\lambda/16$.

The directionality of this electrode pattern can be controlled by changing the width of a portion or the whole of electrode fingers within a value smaller than $\lambda/8$, with center positions of these electrode fingers and the arranging order of these electrode fingers and the spaces being unchanged. Further, the directionality thereof can be controlled by setting the thickness of electrode fingers within a range from $0.002\lambda$ to $0.05\lambda$.

As described hereinbefore, according to the present invention, it is possible to realize an acoustic surface wave device which has a sending electrode, a reflecting electrode and a meandering electrode all of which are arranged under predetermined conditions so that TTE is restricted and thus can realize a complete unidirectionality. There are various fields of application of the present surface acoustic wave device.

The present acoustic surface wave device can be used in a variety of applications.

A device having at least one acoustic surface wave device mentioned hereinbefore may be possible.

Further, a communication device including an electric signal filter comprising the present acoustic surface wave device can be realized.

Figure 54:
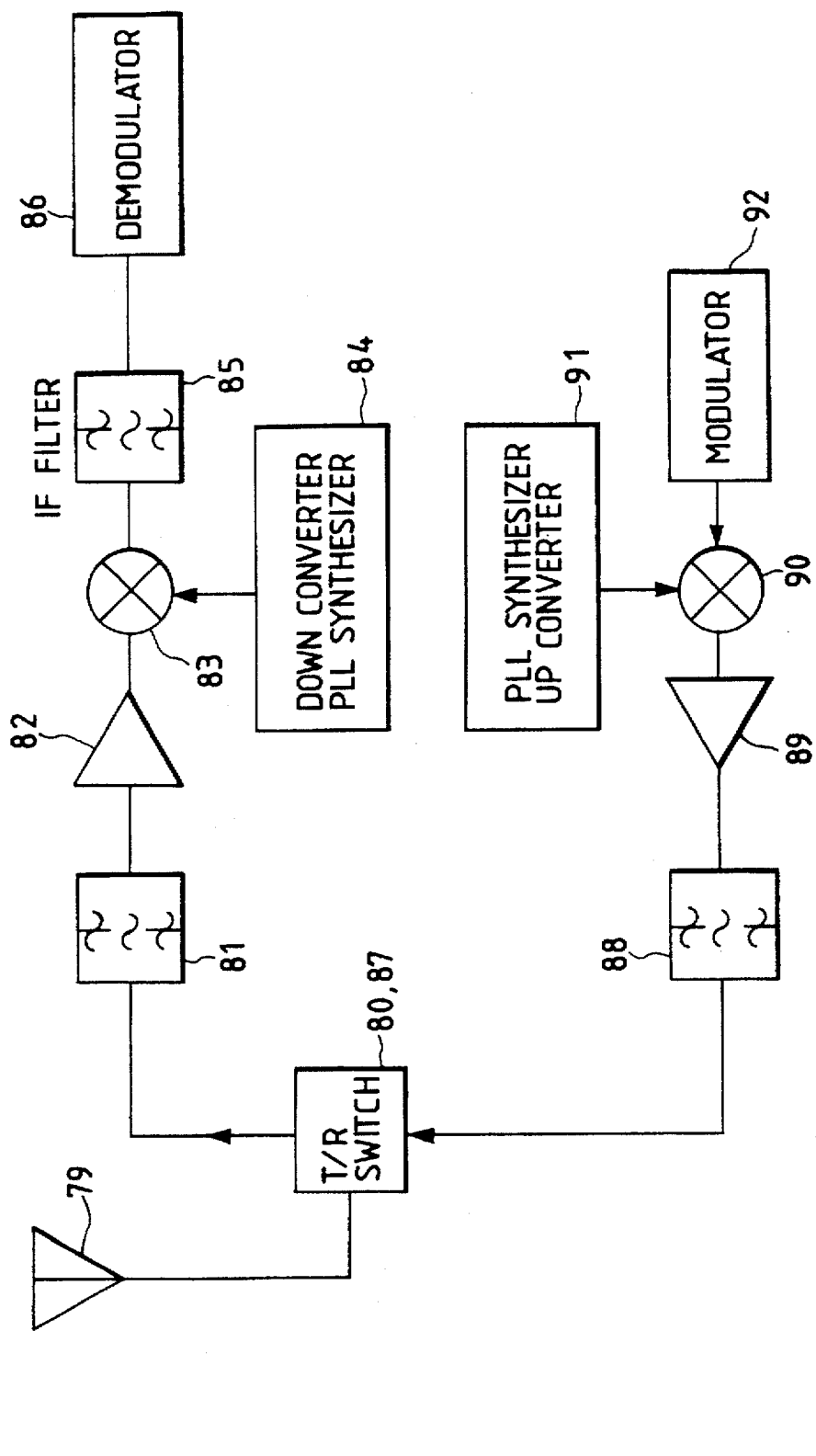
FIG. 54 shows an embodiment of a communication apparatus using the acoustic surface wave device according to the present invention.

FIG. 54 shows an acoustic surface wave device according to a thirty-sixth embodiment of the present invention which is an example of such communication apparatus.

In FIG. 54, the communication apparatus is composed of a receiver including an antenna 79, a transmission/receiving switch 80, a receiving filter 81, a receiving amplifier 82, a receiving mixer 83, a down-converter/PLL synthesizer 84, an intermediate frequency filter 85 and a demodulator 86 and a transmitter including the antenna 79, the switch 80, a tansmitting filter 88, a transmitting amplifier 89, a transmitting mixer 90, an up-converter/PLL synthesizer 91 and a modulator 92.

The antenna 79 may be of a parabola or a rod type.

The switch 80, the filters 81 and 88, the amplifiers 82 and 89, the mixers 83 and 90, the down-converter/PLL synthesizer 84, the up-converter/PLL synthesizer 91, the modulator 92 and the demodulator 86 can be realized by using electronic devices such as, for example, CPU, ROM, RAM, various CMOSs, various TTLs, resistors, transistors, coils, capacitors, etc.

The IF filter 85 comprises an acoustic surface wave device according to the present invention, so that the communication device can be miniaturized by reducing the number of peripheral elements such as phase-shifters.

In operation, a signal to be transmitted is modulated by the modulator 92 and the modulated signal and a signal from the up-converter/PLL synthesizer 91 are mixed by the transmitting mixer 90. The mixed signal is amplified by the amplifier 89, filtered by the filter 88 and sent through the switch 80 switched to a transmitting side and the antenna 79 in a predetermined direction.

In receiving a signal, the signal received by the antenna 79 is passed through the switch 80 switched to a receiving side to the filter 81 and, after filtered thereby, amplified by the amplifier 82 and mixed with an output signal of the down-converter/PLL synthesizer 84 by the mixer 83, resulting in an IF signal.

The IF signal is filtered by the IF filter 85 and then demodulated by the demodulator 86 to recover the original signal.

Since it is general requirement that a communication device should be compact and light-weight, the number of circuit elements to be arranged around an acoustic surface wave filter should be as small as possible.

By using the surface acoustic wave filter according to the present invention, the communication apparatus shown in FIG. 54 can be miniaturized due to elimination of phase-shifter element and its performance can be improved.

Further, various regulations to be performed in the communication device to accommodate to the reduction of the number of phase-shifter elements can be simplified.

It should be noted that the present acoustic surface wave device is applicable to other fields than the communication device shown in FIG. 54.

As described hereinbefore, according to the present invention, a novel structure of an acoustic surface wave device including a peripheral circuit is provided, which has a frequency characteristics and group delay time characteristics with ripples minimized by suppressing acoustic reflection.

Further, it is possible to obtain a low loss unidirectional surface acoustic wave device which has a novel structure providing frequency characteristics and group delay time characteristics with minimized ripple with using minimum number of phase-shifter, resulting in simplified peripheral circuit, miniaturized device and high performance.

Further, it is possible to improve the performance of an apparatus using the acoustic surface wave device, miniaturize the apparatus and eliminate necessity of regulation.

What is claimed is:

1. A surface acoustic wave device combined with an electric circuit connected thereto, said surface acoustic wave device comprising a surface acoustic wave substrate and at least two interdigital transducers formed on said surface acoustic wave substrate, at least one of said interdigital transducers and/or said electric circuit having an internal dissipation of input signal energy, wherein said at least one interdigital transducer includes electrode means which together with said electric circuit, connected thereto, satisfies the following equation pertaining to mechanical reflection:

$$\left\{\mu\cos\Theta_3 - \Gamma\cos\Theta_1 + \sqrt{\begin{array}{c}(\Gamma\cos\Theta_1 - \mu\cos\Theta_3)^2 - \\ \Gamma^2 + (\kappa+1)(2\mu\Gamma\cos\Theta_2 + \\ \kappa\alpha_{11} - \mu^2) - \kappa\alpha_{33}\end{array}}\right\}/(1+\kappa) \leq 1/3$$

where ($\alpha$) is a matrix resulting from a multiplication of a scattering matrix (S) with a complex conjugate matrix (S*) thereof when a unidirectional interdigital transducer is represented by an equivalent circuit of said at least one interdigital transducer combined with said electric circuit connected thereto, which has a first, forward acoustic terminal, a second, backward acoustic terminal and a third, electric terminal, $\kappa=(|S_{23}|^2/|S_{13}|^2)$ is a directionality coefficient, $\Theta_1$ is $\arg(S_{13}{}^2 S_{33}{}^* S_{11}{}^*)$, $\Theta_2$ is $\arg(\alpha_{13}{}^* S_{33} S_{13}{}^*)$, $\Theta_3$ is $\arg(\alpha_{13}{}^* S_{13} S_{11}{}^*)$, $\mu$ is $\alpha_{13}/|S_{13}|$ and $\Gamma=|S_{33}|$ is indicative of electric reflection.

2. A surface acoustic wave device combined with an electric circuit connected thereto, said surface acoustic wave device comprising a surface acoustic wave substrate and at least two interdigital transducers formed on said surface acoustic wave substrate, at least one of said interdigital transducers and/or said electric circuit having an internal dissipation of input signal energy, wherein said at least one interdigital transducer includes electrode means which together with said electric circuit, connected thereto, satisfies the following equation pertaining to acoustic reflection:

$$\{\mu - \gamma + \sqrt{\kappa(2\mu\gamma + \alpha_{11} + \kappa\alpha_{11} - \alpha_{33} - \mu^2)}\}/(\kappa+1) \leq 1/3$$

where ($\alpha$) is a matrix resulting from a multiplication of a scattering matrix (S) with a complex conjugate matrix (S*) thereof when a unidirectional interdigital transducer is represented by an equivalent circuit of said at least one interdigital transducer combined with said electric circuit, which has a first, forward acoustic terminal, a second, backward acoustic terminal and a third, electric terminal, one of said first and second terminals being selected such that elements of the scattering matrix (S) become real numbers, $\kappa=(|S_{23}|^2/|S_{13}|^2)=(S_{23}{}^2/S_{13}{}^2)$ is a directionality coefficient, $\mu$ is $\alpha_{13}/|S_{13}|$ and $\gamma=S_{33}$ is indicative of electric reflection.

3. The surface acoustic wave device combined with the electric circuit connected thereto, claimed in claim 1, wherein a total reflection over said interdigital transducers due to a difference in characteristic impedances with respect to a surface acoustic wave between portions of said surface acoustic wave substrate on which said interdigital transducers are formed and other portions of said surface acoustic wave substrate on which there is no interdigital transducer formed is substantially zero in the vicinity of a main response frequency, said total reflection being made substantially zero by setting a width of at least one of electrode fingers of a pair of interdigital electrodes of at least one of said interdigital transducers to $\lambda/8$ and setting a space between said at least one electrode finger associated with one of the pair of interdigital electrodes and one of electrode fingers of the other one of the pair of interdigital electrodes to $\lambda/8$, where $\lambda$ is a wavelength of the surface acoustic wave at a center frequency of said surface acoustic wave device combined with said electric circuit.

4. A surface acoustic wave device combined with an electric circuit connected thereto, said surface acoustic wave device comprising a surface acoustic wave substrate and at least two interdigital transducers formed on said surface acoustic wave substrate, at least one of said interdigital transducers and/or said electric circuit having an internal dissipation of input signal energy, wherein said surface acoustic wave device includes electrode means such that when combined with said electric circuit satisfies the following equation pertaining to acoustic reflection:

$$|\{[(\kappa-1)/(\kappa+1)](b+g)+1\}/(1+b+g)| \leq 1/3$$

where (S) is a scattering matrix when a unidirectional electrode is represented by an equivalent circuit of said at least one interdigital transducer combined with said electric circuit connected thereto, which has a first, forward acoustic terminal, a second, backward acoustic terminal and a pair of third, electric terminals, (S*) is a complex conjugate matrix thereof, $\kappa=(|S_{23}|^2/|S_{13}|^2)=(S_{23}{}^2/S_{13}{}^2)$ is a directionality coefficient, Ga is radiation conductance of an interdigital reed electrode as viewed from the electric terminals, Gl is conductance on the side of an applied power source or load, gu is a conductance component connected as a parallel element across the electric terminals and represents the internal dissipation, g=gu/Ga and b=Gl/Ga.

5. A surface acoustic wave device combined with an electric circuit connected thereto, said surface acoustic wave device comprising a surface acoustic wave substrate and at least two interdigital transducers formed on said surface acoustic wave substrate, at least one of said interdigital transducers and/or said electric circuit having an internal dissipation of input signal energy, wherein said surface acoustic wave device includes electrode means such that when combined with said electric circuit satisfies the following equation pertaining to acoustic reflection:

$$|\{[(\kappa-1)/(\kappa+1)]+(1/b)+r\}/[1+(1/b)+r]| \leq 1/3$$

where (S) is a scattering matrix when a unidirectional electrode is represented by an equivalent circuit of said at least one interdigital transducer combined with said electric circuit connected thereto, which has a first, forward acoustic terminal, a second, backward acoustic terminal and a pair of third, electric terminals, (S*) is a complex conjugate matrix thereof, $\kappa=(|S_{23}|^2)/|S_{13}|^2)=(S_{23}{}^2/S_{13}{}^2)$ is a directionality coefficient, Ga is radiation conductance of said interdigital transducer as viewed from the electric terminals, Gl is conductance on the side of an applied power source or load, ru is a resistive component connected as a series element between one of the electric terminals and said forward acoustic terminal and represents the internal dissipation, r=ru×Ga, and b=Gl/Ga.

6. A surface acoustic wave device combined with an electric circuit connected thereto, said surface acoustic wave device comprising a surface acoustic wave substrate and at least two interdigital transducers formed on said surface acoustic wave substrate and being combined with said electric circuit to form a unidirectional interdigital transducer, at least one of said interdigital transducers and/or said electric circuit having an internal dissipation of input signal energy, wherein an element $\alpha_{33}$ is defined by the following equation:

$$\alpha_{33} = \alpha_0 + \sum_{m=1}^{\infty} \beta_m + |1 + S_{33}|^{2m} + \sum_{m=1}^{\infty} \beta_m - |1 - S_{33}|^{2m}$$

where $\alpha_{33}$ is an element of ($\alpha$), which is related to an electric terminal and represents a coefficient of internal dissipation, ($\alpha$) being a matrix resulting from multiplication of a scattering matrix (S) with a complex conjugate matrix (S*) thereof when the unidirectional interdigital transducer is represented by an equivalent circuit including a first, forward acoustic terminal, a second, backward acoustic terminal and a third, said electric terminal.

* * * * *